(12) United States Patent
Nakajima et al.

(10) Patent No.: US 6,727,124 B2
(45) Date of Patent: Apr. 27, 2004

(54) METHOD OF MANUFACTURING A TFT USING A CATALYTIC ELEMENT TO PROMOTE CRYSTALLIZATION OF A SEMICONDUCTOR FILM AND GETTERING THE CATALYTIC ELEMENT

(75) Inventors: Setsuo Nakajima, Kanagawa (JP); Hideto Ohnuma, Kanagawa (JP); Naoki Makita, Nara (JP); Takuya Matsuo, Osaka (JP)

(73) Assignees: Semiconductor Energy Laboratory Co., Ltd. (JP); Sharp Kabushiki Kaisha (JP)

( * ) Notice: Subject to any disclaimer, the term of this patent is extended or adjusted under 35 U.S.C. 154(b) by 46 days.

(21) Appl. No.: 10/000,238

(22) Filed: Nov. 2, 2001

(65) Prior Publication Data

US 2002/0053674 A1 May 9, 2002

(51) Int. Cl.$^7$ .............................................. H01L 21/84
(52) U.S. Cl. ...................... 438/154; 438/163; 438/166; 438/487
(58) Field of Search .................................. 438/154, 163, 438/166, 487, 153, 160, 164, 473

(56) References Cited

U.S. PATENT DOCUMENTS

| 5,643,826 A | | 7/1997 | Ohtani et al. .................. 437/88 |
| 5,893,990 A | * | 4/1999 | Tanaka ..................... 219/121.8 |
| 5,923,962 A | | 7/1999 | Ohtani et al. ................ 438/150 |
| 6,133,075 A | * | 10/2000 | Yamazaki et al. ........... 438/158 |
| 6,251,712 B1 | * | 6/2001 | Tanaka et al. .............. 438/143 |
| 6,432,756 B1 | * | 8/2002 | Ohtani et al. ................ 438/166 |
| 6,452,211 B1 | * | 9/2002 | Ohtani et al. .................. 257/64 |
| 6,465,288 B1 | * | 10/2002 | Ohnuma ...................... 438/166 |
| 6,506,636 B2 | * | 1/2003 | Yamazaki et al. ........... 438/149 |
| 2002/0028544 A1 | * | 3/2002 | Fujimoto et al. ............ 438/166 |

FOREIGN PATENT DOCUMENTS

JP 7-130652 5/1995

OTHER PUBLICATIONS

English abstract re Japanese Patent Application No. JP 7-130652.

* cited by examiner

*Primary Examiner*—Carl Whitehead, Jr.
*Assistant Examiner*—Stephen W. Smoot
(74) *Attorney, Agent, or Firm*—Cook, Alex, McFarron, Manzo, Cummings & Mehler, Ltd.

(57) ABSTRACT

A catalytic element for promoting crystallization of an amorphous silicon film is efficiently gettered to provide a highly reliable TFT, and an electro-optical device using the TFT and a method of manufacturing the electro-optical device are provided. The electro-optical device has an n-channel TFT and a p-channel TFT. A semiconductor layer of the p-channel TFT has a channel forming region (13), a region (11) containing an n-type impurity element and a p-type impurity element, and a region (12) containing only a p-type impurity element. In the p-channel TFT, a wiring line for electrically connecting the TFTs is connected to the region (12) containing only a p-type impurity element. The region containing an n-type impurity element in the p-channel TFT is narrower than a region doped with an n-type impurity element in a semiconductor layer of the n-channel TFT.

28 Claims, 11 Drawing Sheets

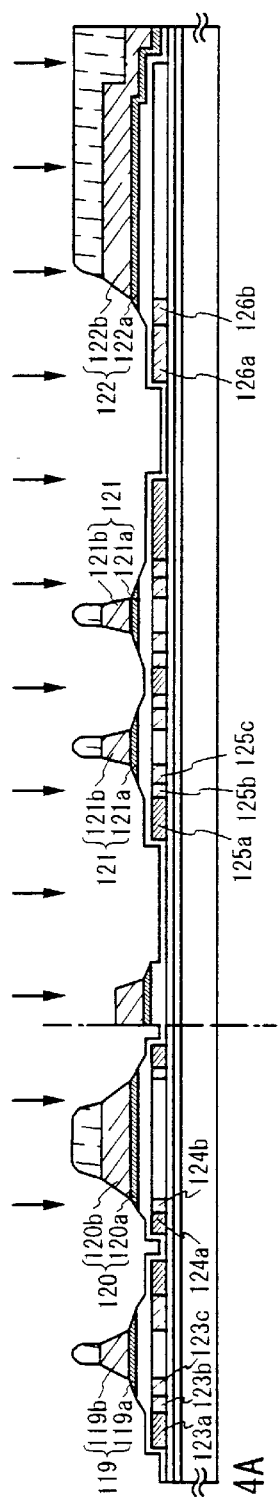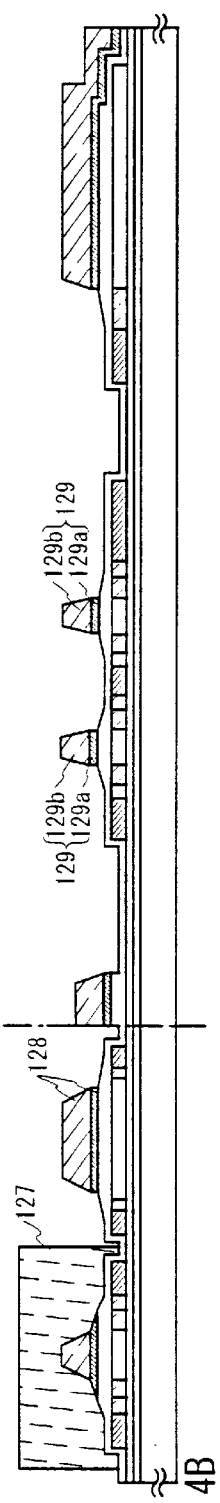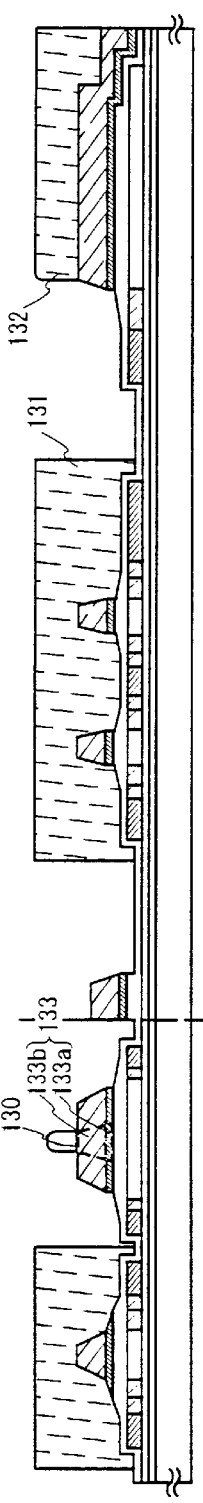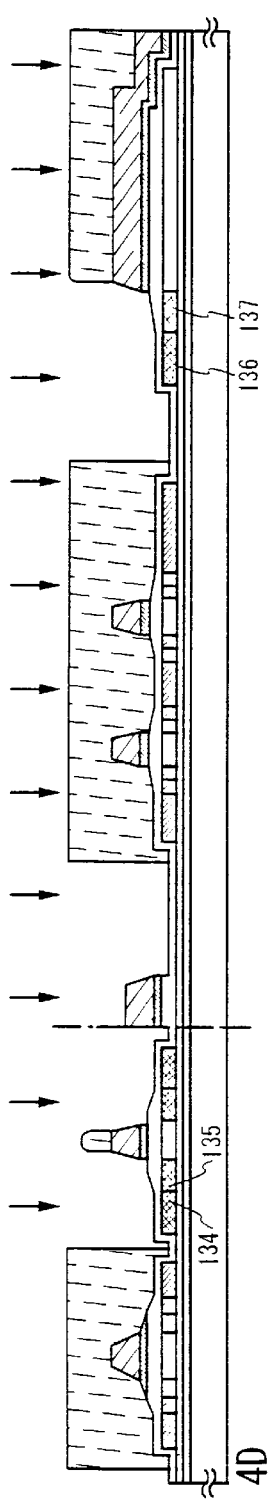

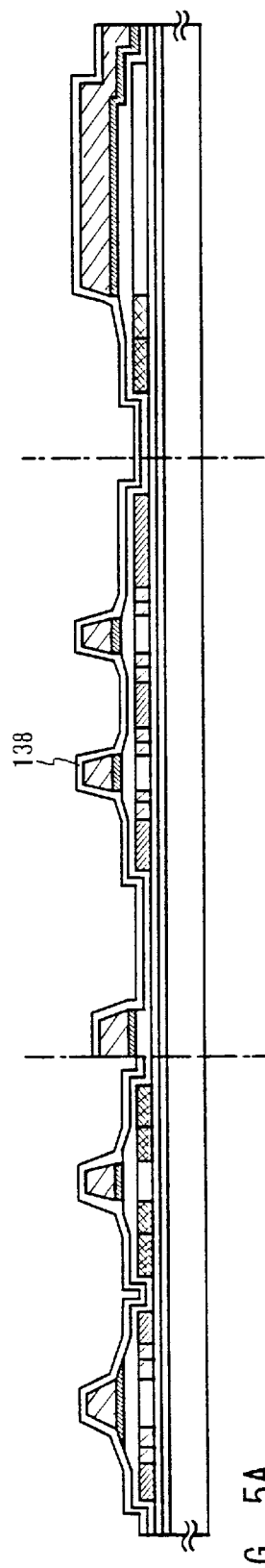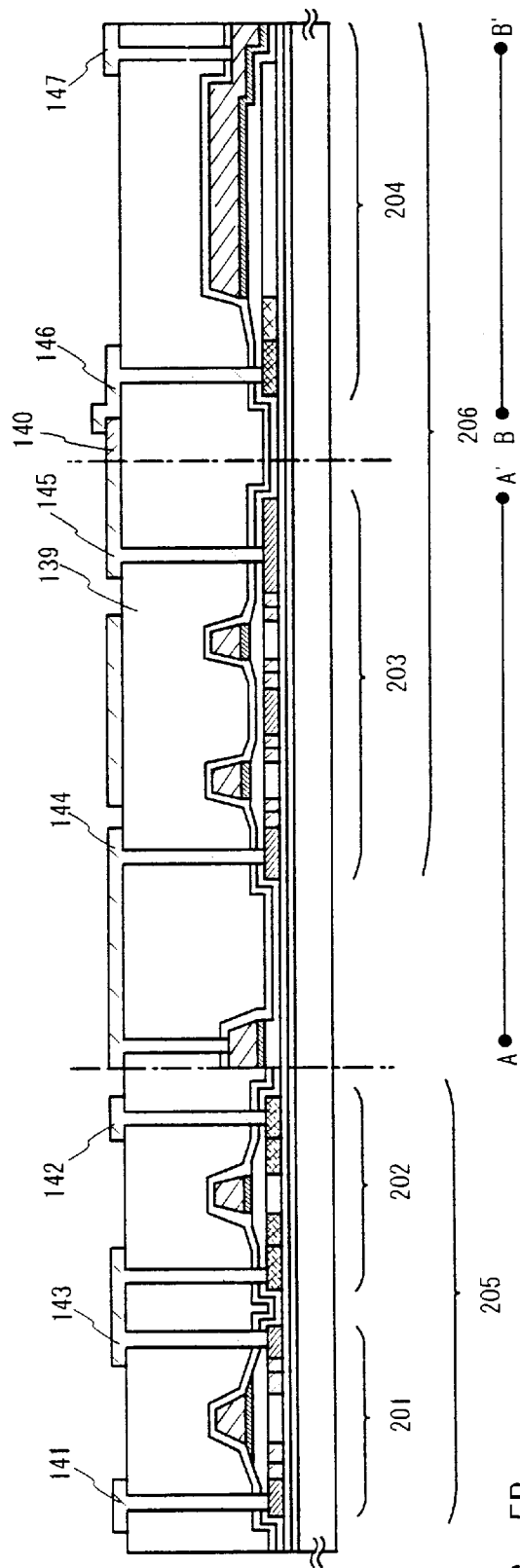
FIG. 5A
FIG. 5B

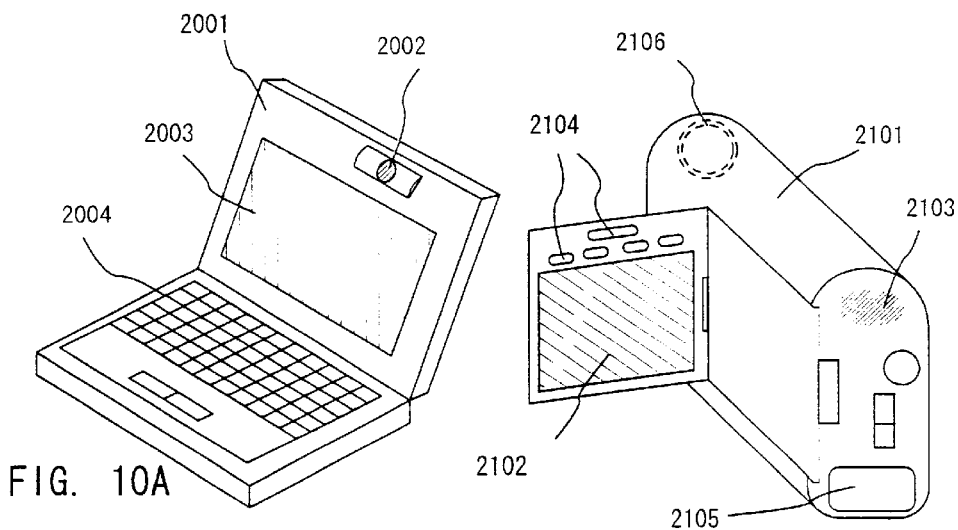
FIG. 10A
FIG. 10B
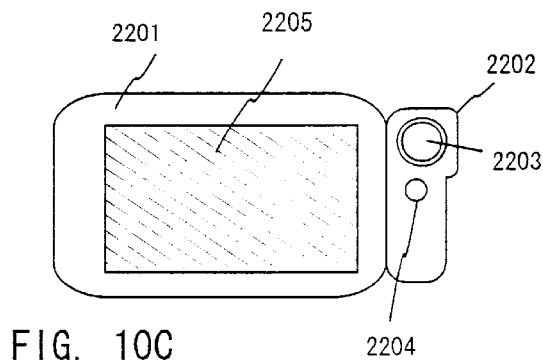
FIG. 10C
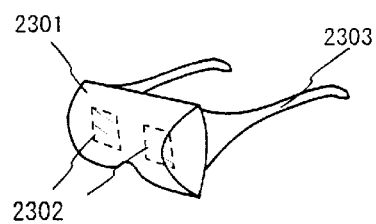
FIG. 10D
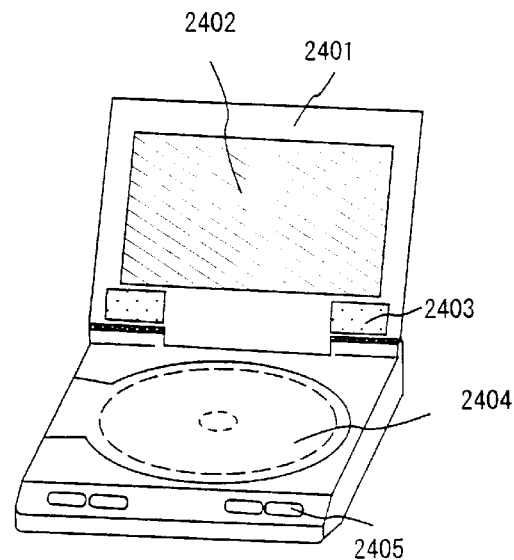
FIG. 10E
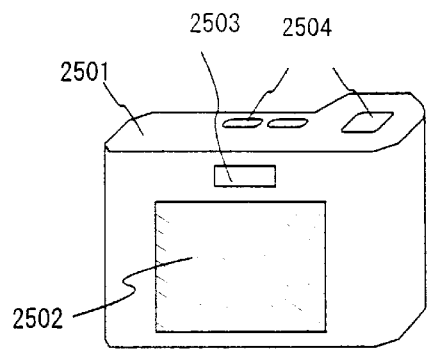
FIG. 10F

METHOD OF MANUFACTURING A TFT USING A CATALYTIC ELEMENT TO PROMOTE CRYSTALLIZATION OF A SEMICONDUCTOR FILM AND GETTERING THE CATALYTIC ELEMENT

BACKGROUND OF THE INVENTION

1. Field of the Invention

The present invention relates to an electro-optical device (semiconductor device) including a circuit that is composed of a thin film transistor (hereinafter referred to as TFT) formed on an insulator, and to a method of manufacturing the same. Specifically, the present invention relates to an electro-optical device (semiconductor device) represented by a liquid crystal display device in which a pixel portion and a driving circuit provided in the periphery of the pixel portion are formed on the same substrate, and to an electronic appliance using the electro-optical device (semiconductor device) as a display unit.

2. Description of the Related Art

In recent years, a large number of TFTs have been developed which use as an active layer a polycrystalline semiconductor film obtained by crystallizing an amorphous semiconductor film that is formed on an insulating substrate such as a glass substrate. In particular, polysilicon films or other crystalline silicon films obtained by crystallizing an amorphous silicon film are often employed.

A process of forming a large-area polysilicon film on a substrate that has a low resistivity against heat, such as a glass substrate and a plastic substrate, is also a research and development theme that continues to attract researchers. Crystallization using laser light and crystallization involving doping with a crystallization-promoting catalytic element and heat treatment are given as examples of a so-called low temperature crystallization technique.

One of the latter crystallization techniques, in which an amorphous silicon film is doped with a catalytic element for promoting crystallization and then subjected to heat treatment to be crystallized, is disclosed in Japanese Patent Application Laid-open No. Hei 7-130652.

According to this technique, the temperature required to crystallize an amorphous silicon film can be lowered by 50 to 100° C. and time required for crystallization is shortened to 1/5 to 1/10 as well with the effect of a catalytic element. The technique thus makes it possible to form a crystalline silicon film having a large surface area on a substrate of low heat resistance as those mentioned above. Also, it is a confirmed fact that a crystalline silicon film obtained by this technique has an excellent crystallinity.

The above crystallization technique using a catalytic element employs a metal element such as Ni and Co for the catalytic element. These metal elements generate a great energy level in the silicon film to trap carriers and cause recombination of the carriers. Therefore, when the obtained crystalline silicon film is used to form a TFT, it is expected that the electric characteristic and the reliability of the TFT are affected.

In addition, the catalytic element remaining in the silicon film has been observed to segregate irregularly. The catalytic element segregates most in crystal grain boundaries, and it is considered that this segregation provides a leak path for a small amount of current and causes an abrupt increase in OFF current (a current flowing in a TFT when the TFT is in an OFF state).

For that reason, the catalytic element has to be quickly removed, or reduced to a degree that it does not exert any electric influence, once the crystallization step is finished. A technique that utilizes the gettering effect can be used to remove or reduce the catalytic element.

One of existing gettering methods includes the steps of partially covering, with a resist mask, a crystalline silicon film obtained by crystallizing an amorphous silicon film with the help of a metal element so as to cover a portion of the crystalline silicon film that is to serve as a channel forming region in a semiconductor layer of a TFT, and doping the rest of the semiconductor layer of the TFT with P or other Group 15 elements effective in gettering in high concentration to form a region that promotes gettering (the region is hereinafter called a gettering sink). Another example of the existing gettering methods involves similarly covering the region of the crystalline silicon film that serves as the channel forming region of the TFT with a resist mask and forming a gettering sink containing P or other Group 15 elements in high concentration in the periphery of a portion of the crystalline silicon film that forms the semiconductor layer of the TFT. However, these methods need the mask formation step, thereby resulting in increases in the number of masks and the number of manufacturing steps. Therefore, the methods have problems in productivity, yield, and manufacturing cost.

Further, when a p-channel TFT is formed, a region for forming the p-channel TFT is doped with a p-type impurity element (boron (B), in this example) to form a source region and a drain region after doped with a large amount of phosphorus for gettering. In order to invert the n-type conductivity of the region for forming the p-channel TFT, which has been given by phosphorus (P) through the previous doping, the region has to be doped with boron (B) in considerably high concentration.

This brings a problem of reduced throughput in the doping step, or a problem of difficulty in improving the crystallinity of the source region and the drain region by heat treatment.

The semiconductor layer has to be doped with phosphorus (P) in order to carry out the gettering treatment. However, doping with a p-type impurity element (typically, boron (B)) is also needed to form a p-channel TFT. Since the step of doping with an n-type impurity element (phosphorus (P)) precedes the step of doping the semiconductor layer of the p-channel TFT with boron (B), the layer has to be doped with the p-type impurity element in a concentration high enough to invert the n-type conductivity to the p-type conductivity (called counter doping or cross doping). The concentration of boron (B) in the layer has to be higher than the concentration of phosphorus (P) with which the layer has previously been doped. However, if the concentration of the impurity element is too high, the resistivity of the source drain region is raised to lower ON current. Counter doping is also unsatisfactory in terms of manufacture cost and productivity because it requires excessive ions as acceptors for doping.

SUMMARY OF THE INVENTION

The present invention has been made in view of the above, and an object of the present invention is therefore to provide a highly reliable electro-optical device and a method of manufacturing the electro-optical device by efficiently gettering a catalytic element used to promote crystallization of an amorphous silicon film.

One of the features of the presnet invention is an electric device comprising a semiconductor layer on an insulator, a gate insulating film on the semiconductor layer, and a gate electrode on the gate insulating film, wherein the electric device has an n-channel TFT and a p-channel TFT, wherein the semiconductor layer in the p-channel TFT includes a channel forming region (13), a region (11) containing an n-type impurity element and a p-type impurity element, and a region (12) containing only a p-type impurity element, and wherein a wiring line for electrically connecting the TFTs to one another is connected to the region (12) containing only a p-type impurity element in the p-channel TFT.

Another one of the features of the presnet invention is an electric device comprising a semiconductor layer on an insulator, a gate insulating film on the semiconductor layer, and a gate electrode on the gate insulating film, wherein the electric device has an n-channel TFT and a p-channel TFT, wherein the semiconductor layer in the p-channel TFT includes a channel forming region (13), a region (21a, 21b) containing an n-type impurity element and a p-type impurity element, and a region (22) containing only a p-type impurity element, wherein the region (22) containing only a p-type impurity element is sandwiched between the region (21a) containing an n-type impurity element and a p-type impurity element and the region (21b) containing an n-type impurity element and a p-type impurity element, and wherein a wiring line for electrically connecting the TFTs to one another is connected to the region (12) containing only a p-type impurity element in the p-channel TFT.

In the above electric device, wherein the gate electrode is a single layer or a laminate formed of elements selected from the group consisting of Ta, W, Ti, Mo, Al, and Cu, or of alloy materials or compound materials mainly containing these elements.

One of the features of the presnet invention is a method of manufacturing an electrice device, comprising: forming an amorphous semiconductor layer on an insulator; doping the amorphous semiconductor layer with a catalytic element for promoting crystallization; heating the amorphous semiconductor layer doped with the catalytic element to obtain a crystalline semiconductor layer; forming a gate insulating film on the crystalline semiconductor layer; forming a conductive film on the gate insulating film and etching the conductive film to form a gate electrode of an n-channel TFT and to form in a p-channel TFT a conductive layer that is to serve as a gate electrode; doping the semiconductor layer with an n-type impurity element while using the gate electrode and the conductive layer as masks; and etching the conductive layer to form a gate electrode of the p-channel TFT while covering a region that is used for the n-channel TFT with a resist mask, and then doping the semiconductor layer in the p-channel TFT with a p-type impurity element.

One of the features of the presnet invention is a method of manufacturing an electrice device, comprising: forming an amorphous semiconductor layer on an insulator; doping the amorphous semiconductor layer with a catalytic element for promoting crystallization; heating the amorphous semiconductor layer doped with the catalytic element and then irradiating the semiconductor layer with a laser to obtain a crystalline semiconductor layer; forming a gate insulating film on the crystalline semiconductor layer; forming a conductive film on the gate insulating film and etching the conductive film to form a gate electrode of an n-channel TFT and to form in a p-channel TFT a conductive layer that is to serve as a gate electrode; doping the semiconductor layer with an n-type impurity element while using the gate electrode and the conductive layer as masks; and etching the conductive layer to form a gate electrode of the p-channel TFT while covering a region that is used for the n-channel TFT with a resist mask, and then doping the semiconductor layer in the p-channel TFT with a p-type impurity element.

One of the features of the presnet invention is a method of manufacturing an electrice device, comprising: forming an amorphous semiconductor layer on an insulator; doping the amorphous semiconductor layer with a catalytic element for promoting crystallization; heating the amorphous semiconductor layer doped with the catalytic element to obtain a crystalline semiconductor layer; forming a gate insulating film on the crystalline semiconductor layer; forming a conductive film (A) and a conductive film (B) on the gate insulating film; etching the conductive film (A) and the conductive film (B) to form first shape gate electrodes; doping the semiconductor layer with an n-type impurity element while using the first shape gate electrodes as masks; etching the first shape gate electrodes to form second shape gate electrodes narrower than the first shape gate electrodes; doping the semiconductor layer with an n-type impurity element while using as masks the second shape gate electrodes; etching the second shape gate electrodes to form third shape gate electrodes; etching the third shape gate electrodes to form fourth shape gate electrodes; and doping the semiconductor layer in the p-channel TFT with a p-type impurity element while using the fourth shape gate electrodes as masks.

One of the features of the presnet invention is a method of manufacturing an electrice device, comprising: forming an amorphous semiconductor layer on an insulator; doping the amorphous semiconductor layer with a catalytic element for promoting crystallization; heating the amorphous semiconductor layer doped with the catalytic element and then irradiating the amorphous semiconductor layer with a laser to obtain a crystalline semiconductor layer; forming a gate insulating film on the crystalline semiconductor layer; forming a conductive film (A) and a conductive film (B) on the gate insulating film; etching the conductive film (A) and the conductive film (B) to form first shape gate electrodes; doping the semiconductor layer with an n-type impurity element while using the first shape gate electrodes as masks; etching the first shape gate electrodes to form second shape gate electrodes narrower than the first shape gate electrodes; doping the semiconductor layer with an n-type impurity element while using as masks the second shape gate electrodes; etching the second shape gate electrodes to form third shape gate electrodes; etching the third shape gate electrodes to form fourth shape gate electrodes; and doping the semiconductor layer in the p-channel TFT with a p-type impurity element while using the fourth shape gate electrodes as masks.

One of the features of the presnet invention is a method of manufacturing an electrice device, comprising: forming an amorphous semiconductor layer on an insulator; doping the amorphous semiconductor layer with a catalytic element for promoting crystallization; heating the amorphous semiconductor layer doped with the catalytic element to obtain a crystalline semiconductor layer; forming a gate insulating film on the crystalline semiconductor layer; forming a conductive film (A) and a conductive film (B) on the gate insulating film; etching the conductive film (A) and the conductive film (B) to form a gate electrode (A) and a gate electrode (C); doping the semiconductor layer with an n-type impurity element while using as masks the gate electrode (A) and the gate electrode (C); etching the gate electrodes (A) and (C) to form a gate electrode (B) and a gate electrode (D); doping the semiconductor layer with an n-type impurity element while using as masks the gate electrode (B) and the gate electrode (D); etching the gate electrode (D) of a p-channel TFT to form a gate electrode (E) while covering an n-channel TFT with a resist mask; and doping the semiconductor layer in the p-channel TFT with a p-type impurity element while using the gate electrode (E) as a mask.

One of the features of the presnet invention is a method of manufacturing an electrice device, comprising: forming an amorphous semiconductor layer on an insulator; doping the amorphous semiconductor layer with a catalytic element for promoting crystallization; heating the amorphous semiconductor layer doped with the catalytic element and then irradiating the amorphous semiconductor layer with a laser to obtain a crystalline semiconductor layer; forming a gate insulating film on the crystalline semiconductor layer; forming a conductive film (A) and a conductive film (B) on the gate insulating film; etching the conductive film (A) and the conductive film (B) to form a gate electrode (A) and a gate electrode (C); doping the semiconductor layer with an n-type impurity element while using as masks the gate electrode (A) and the gate electrode (C); etching the gate electrodes (A) and (C) to form a gate electrode (B) and a gate electrode (D); doping the semiconductor layer with an n-type impurity element while using as masks the gate electrode (B) and the gate electrode (D); etching the gate electrode (D) of a p-channel TFT to form a gate electrode (E) while covering an n-channel TFT with a resist mask; and doping the semiconductor layer in the p-channel TFT with a p-type impurity element while using the gate electrode (E) as a mask.

One of the features of the presnet invention is a method of manufacturing an electrice device, comprising: forming an amorphous semiconductor layer on an insulator; doping the amorphous semiconductor layer with a catalytic element for promoting crystallization; heating the amorphous semiconductor layer doped with the catalytic element to obtain a crystalline semiconductor layer; forming a gate insulating film on the crystalline semiconductor layer; forming a conductive film (A) and a conductive film (B) on the gate insulating film; etching the conductive film (A) and the conductive film (B) to form a gate electrode (A), a gate electrode (C), and a gate electrode (F); doping the semiconductor layer with an n-type impurity element while using as masks the gate electrodes (A), (C), and (F); etching the gate electrodes (A), (C), (F) to form a gate electrode (B), a gate electrode (D), and a gate electrode (G); doping the semiconductor layer with an n-type impurity element while using as masks the gate electrodes (B), (D), and (G); etching the gate electrode (D) of a p-channel TFT and the gate electrode (G) of a pixel TFT to form a gate electrode (D') and a gate electrode (H), respectively, while covering with a resist mask an n-channel TFT that is formed in a driving circuit; etching the gate electrode (D') to form a gate electrode (E); and doping the semiconductor layer in the p-channel TFT with a p-type impurity element while using the gate electrode (E) as a mask.

One of the features of the presnet invention is a method of manufacturing an electrice device, comprising: forming an amorphous semiconductor layer on an insulator; doping the amorphous semiconductor layer with a catalytic element for promoting crystallization; heating the amorphous semiconductor layer doped with the catalytic element to obtain a crystalline semiconductor layer; forming a gate insulating film on the crystalline semiconductor layer; forming a conductive film (A) and a conductive film (B) on the gate insulating film; etching the conductive film (A) and the conductive film (B) to form a gate electrode (A), a gate electrode (C), and a gate electrode (F); doping the semiconductor layer with an n-type impurity element while using as masks the gate electrodes (A), (C), (F); etching the gate electrodes (A), (C), (F) to form a gate electrode (B), a gate electrode (D), and a gate electrode (G); doping the semiconductor layer with an n-type impurity element while using as masks the gate electrodes (B), (D), (G); etching the gate electrode (D) of a p-channel TFT and the gate electrode (G) of a pixel TFT to form a gate electrode (D') and a gate electrode (H), respectively, while covering with a resist mask an n-channel TFT that is formed in a driving circuit; etching the gate electrode (D') to form a gate electrode (E); doping the semiconductor layer in the p-channel TFT with a p-type impurity element while using the gate electrode (E) as a mask; subjecting the insulator to heat treatment; covering the entire surface with an inorganic interlayer insulating film; forming an organic interlayer insulating film on the inorganic interlayer insulating film; forming a contact hole reaching the semiconductor layer through the inorganic interlayer insulating film and the organic interlayer insulating film; forming a pixel electrode on the organic interlayer insulating film; and forming a connection wiring line.

One of the features of the presnet invention is a method of manufacturing an electrice device, comprising: forming an amorphous semiconductor layer on an insulator; doping the amorphous semiconductor layer with a catalytic element for promoting crystallization; heating the amorphous semiconductor layer doped with the catalytic element to obtain a crystalline semiconductor layer; forming a gate insulating film on the crystalline semiconductor layer; forming a conductive film (A) and a conductive film (B) on the gate insulating film; etching the conductive film (A) and the conductive film (B) to form a gate electrode (A), a gate electrode (C), and a gate electrode (F); doping the semiconductor layer with an n-type impurity element while using as masks the gate electrodes (A), (C), (F); etching the gate electrodes (A), (C), (F) to form a gate electrode (B), a gate electrode (D), and a gate electrode (G); doping the semiconductor layer with an n-type impurity element while using as masks the gate electrodes; etching the gate electrode (D) of a p-channel TFT and the gate electrode (G) of a pixel TFT to form a gate electrode (D') and a gate electrode (H), respectively, while covering with a resist mask an n-channel TFT that is formed in a driving circuit; etching the gate electrode (D') to form a gate electrode (E); doping the semiconductor layer in the p-channel TFT with a p-type impurity element while using the gate electrode (E) as a mask; covering the entire surface with an inorganic interlayer insulating film; of gettering the catalytic element through heat treatment; forming an organic interlayer insulating film on the inorganic interlayer insulating film; forming a contact hole reaching the semiconductor layer through the inorganic interlayer insulating film and the organic interlayer insulating film; forming a pixel electrode on the organic interlayer insulating film; and forming a connection wiring line.

One of the features of the presnet invention is a method of manufacturing an electrice device, comprising: forming an amorphous semiconductor layer on an insulator; doping the amorphous semiconductor layer with a catalytic element for promoting crystallization; heating the amorphous semiconductor layer doped with the catalytic element and then irradiating the semiconductor layer with a laser to obtain a crystalline semiconductor layer; forming a gate insulating film on the crystalline semiconductor layer; forming a conductive film (A) and a conductive film (B) on the gate insulating film; etching the conductive film (A) and the conductive film (B) to form a gate electrode (A), a gate electrode (C), and a gate electrode (F); doping the semiconductor layer with an n-type impurity element while using as masks the gate electrodes (A), (C), (F); etching the gate electrodes (A), (C), (F) to form a gate electrode (B), a gate electrode (D), and a gate electrode (G); doping the semiconductor layer with an n-type impurity element while using as masks the gate electrodes (B), (D), (G); etching the gate electrode (D) of a p-channel TFT and the gate electrode (G) of a pixel TFT to form a gate electrode (D') and a gate electrode (H), respectively, while covering with a resist mask an n-channel TFT that is formed in a driving circuit; etching the gate electrode (D') to form a gate electrode (E); doping the semiconductor layer in the p-channel TFT with a p-type impurity element while using the gate electrode (E) as a mask; subjecting the insulator to heat treatment; covering the entire surface with an inorganic interlayer insulating film; forming an organic interlayer insulating film on the inorganic interlayer insulating film; forming a contact hole reaching the semiconductor layer through the inorganic interlayer insulating film and the organic interlayer insulating film; forming a pixel electrode on the organic interlayer insulating film; and forming a connection wiring line.

One of the features of the presnet invention is a method of manufacturing an electrice device, comprising: forming an amorphous semiconductor layer on an insulator; doping the amorphous semiconductor layer with a catalytic element for promoting crystallization; heating the amorphous semiconductor layer doped with the catalytic element and then irradiating the semiconductor layer with a laser to obtain a crystalline semiconductor layer; forming a gate insulating film on the crystalline semiconductor layer; forming a conductive film (A) and a conductive film (B) on the gate insulating film; etching the conductive film (A) and the conductive film (B) to form a gate electrode (A), a gate electrode (C), and a gate electrode (F); doping the semiconductor layer with an n-type impurity element while using as masks the gate electrodes (A), (C), (F); etching the gate electrodes (A), (C), (F) to form a gate electrode (B), a gate electrode (D), and a gate electrode (G); doping the semiconductor layer with an n-type impurity element while using as masks the gate electrodes (B), (D), (G); etching the gate electrode (D) of a p-channel TFT and the gate electrode (G) of a pixel TFT to form a gate electrode (D') and a gate electrode (H), respectively, while covering with a resist mask an n-channel TFT that is formed in a driving circuit; etching the gate electrode (D') to form a gate electrode (E); doping the semiconductor layer in the p-channel TFT with a p-type impurity element while using the gate electrode (E) as a mask; covering the entire surface with an inorganic interlayer insulating film; gettering the catalytic element through heat treatment; forming an organic interlayer insulating film on the inorganic interlayer insulating film; forming a contact hole reaching the semiconductor layer through the inorganic interlayer insulating film and the organic interlayer insulating film; forming a pixel electrode on the organic interlayer insulating film; and forming a connection wiring line.

One of the features of the presnet invention is a method of manufacturing an electrice device, comprising: forming an amorphous semiconductor layer on an insulator; doping the amorphous semiconductor layer with a catalytic element for promoting crystallization; heating the amorphous semiconductor layer doped with the catalytic element to obtain a crystalline semiconductor layer; forming a gate insulating film on the crystalline semiconductor layer; forming a conductive film (A) and a conductive film (B) on the gate insulating film; etching the conductive film (A) and the conductive film (B) to form a gate electrode (A), a gate electrode (C), and a gate electrode (F); doping the semiconductor layer with an n-type impurity element while using as masks the gate electrodes (A), (C), (F); etching the gate electrodes (A), (C), (F) to form a gate electrode (B), a gate electrode (D), and a gate electrode (G); doping the semiconductor layer with an n-type impurity element while using as masks the gate electrodes (B), (D), (G); etching the gate electrode (D) of a p-channel TFT and the gate electrode (G) of a pixel TFT to form a gate electrode (D') and a gate electrode (H), respectively, while covering with a resist mask an n-channel TFT that is formed in a driving circuit; etching the gate electrode (D') to form a gate electrode (E); removing the gate insulating film while using the gate electrode (B), the gate electrode (E), and the gate electrode (H) as masks; and doping the semiconductor layer in the p-channel TFT with a p-type impurity element while covering the n-channel TFT and the pixel TFT with a resist mask and using the gate electrode (E) as a mask.

One of the features of the presnet invention is a method of manufacturing an electrice device, comprising: forming an amorphous semiconductor layer on an insulator; doping the amorphous semiconductor layer with a catalytic element for promoting crystallization; heating the amorphous semiconductor layer doped with the catalytic element and then irradiating the semiconductor layer with a laser to obtain a crystalline semiconductor layer; forming a gate insulating film on the crystalline semiconductor layer; forming a conductive film (A) and a conductive film (B) on the gate insulating film; etching the conductive film (A) and the conductive film (B) to form a gate electrode (A), a gate electrode (C), and a gate electrode (F); doping the semiconductor layer with an n-type impurity element while using as masks the gate electrodes (A), (C), (F); etching the gate electrodes (A), (C), (F) to form a gate electrode (B), a gate electrode (D), and a gate electrode (G); doping the semiconductor layer with an n-type impurity element while using as masks the gate electrodes (B), (D), (G); etching the gate electrode (D) of a p-channel TFT and the gate electrode (G) of a pixel TFT to form a gate electrode (D') and a gate electrode (H), respectively, while covering with a resist mask an n-channel TFT that is formed in a driving circuit; etching the gate electrode (D') to form a gate electrode (E); removing the gate insulating film while using the gate electrode (B), the gate electrode (E), and the gate electrode (H) as masks; and doping the semiconductor layer in the p-channel TFT with a p-type impurity element while covering the n-channel TFT and the pixel TFT with a resist mask and using the gate electrode (E) as a mask.

In the above method, wherein the gate electrode (B), the gate electrode (E), and the gate electrode (H) are formed from the conductive film (A) and the conductive film (B), and the conductive film (A) is wider than the conductive film (B).

In the above method, wherein the laser used to irradiate the semiconductor layer that is doped with the catalytic element is a pulse oscillation type KrF excimer laser, XeCl excimer laser, YAG laser, or $YVO_4$ laser.

A method of manufacturing an electro-optical device (semiconductor device) according to the present invention will be described. A conductive film (A) and a conductive film (B) are formed on a gate insulating film and patterned to form gate electrodes. In forming the gate electrodes, a gate electrode of an n-channel TFT is obtained by patterning the conductive films into a given shape. For a gate electrode (C) of a p-channel TFT, on the other hand, the conductive film (A) and the conductive film (B) are patterned in this etching step such that the gate electrode (C) is wider in the channel length direction than a gate electrode (B) of the n-channel TFT. This is for using later the gate electrode (C) as a mask in an n-type impurity element doping step so as to prevent a region doped with an n-type impurity element from getting too large in a semiconductor layer of the p-channel TFT. Using the gate electrode (C) as a mask, a region in the semiconductor layer that does not overlap the gate electrode (C) is doped with phosphorus (P). The region doped with phosphorus (P) functions as a gettering sink.

A gate electrode (D) of the p-channel TFT is next patterned into a given shape to form a gate electrode (E) having the given shape. Thereafter, the semiconductor layer of the p-channel TFT is doped with boron (B) to give the layer the p-type conductivity. Through the above steps, a channel forming region, a region doped with phosphorus (P) and boron (B), and a region doped with boron (B) alone are formed in the semiconductor layer of the p-channel TFT.

According to the present invention, the distance the catalytic element travels in the semiconductor layer of the p-channel TFT during gettering can be shortened. As a result, less catalytic elements segregate in crystal grain boundaries and therefore leak path of a small amount of current and an abrupt increase in OFF current due to the segregation take place less frequently. The characteristic and the reliability of the TFT are thus improved.

BRIEF DESCRIPTION OF THE DRAWINGS

In the accompanying drawings:

FIGS. 4A to 4D are diagrams of the embodiment of the present invention;

FIGS. 5A and 5B are diagrams of the embodiment of the present invention;

FIGS. 10A to 10F are diagrams showing examples of an electric appliance that employs as a display unit a semiconductor device manufactured in accordance with the present invention;

DETAILED DESCRIPTION OF THE PREFERRED EMBODIMENTS

The invention disclosed in this embodiment is characterized by a method of forming a gate electrode of a p-channel TFT into a given shape. The invention will be described with reference to FIGS. 1A to 1C.

According to the invention disclosed in this specification, the amount of phosphorus (P) used is reduced to solve the problems mentioned above.

In order to prevent catalytic elements from segregating in crystal grain boundaries and thus impairing characteristics of a TFT, the distance the catalytic elements travel from a channel forming region to a source region and to a drain region in a semiconductor layer during gettering is shortened as much as possible.

Figure 1D:
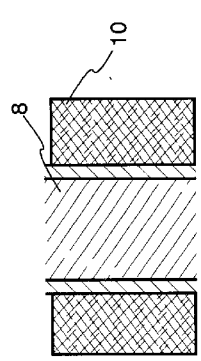
FIGS. 1A to 1G are diagrams showing an embodiment mode of the present invention.
Figure 1E:
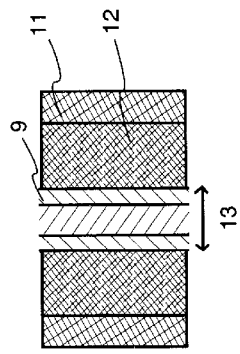

Therefore a gate electrode of an n-channel TFT and a gate electrode of the p-channel TFT are formed into given shapes in separate etching steps in the present invention. As shown in FIG. 1A, the gate electrode of an n-channel type TFT is formed in predetermined shape by the etching, and then the n-type impurity elements are added. FIG. 1D is illustrated the view taken from the top surface of the p-channel type TFT at this point. The conductive film (A) and the conductive film (B) are etched so as to form a gate electrode 8, which is larger than the last gate electrode of the p-channel type TFT. The region 10 is formed, which is added the phosphorus of n-type impurity element, using the gate electrode 8 as a mask.

Figure 1F:
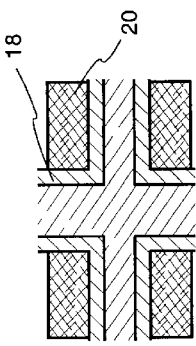
Figure 1G:
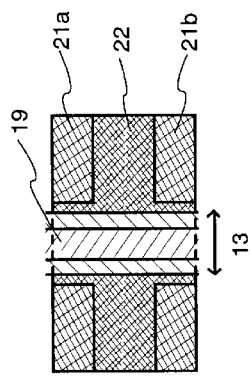
Figure 1A:
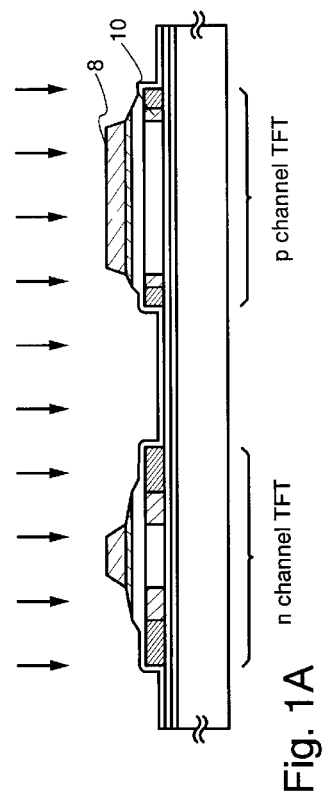
Figure 1B:
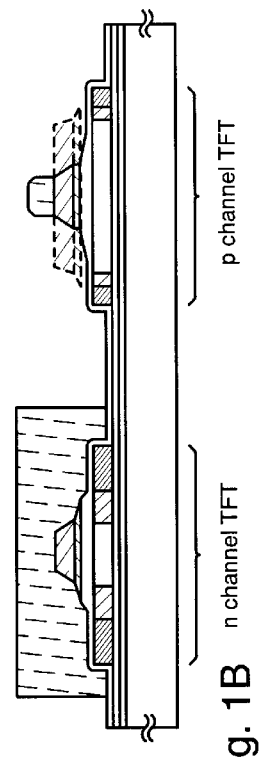
Figure 1C:
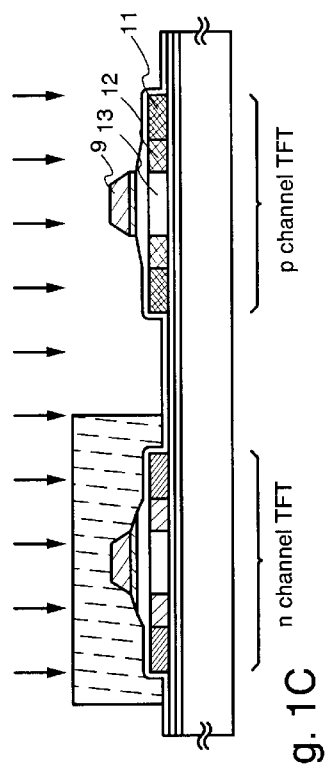

Next, as shown in FIG. 1B, the predetermined shaped gate electrode is formed etching the gate electrode 8 of p-channel type TFT after the mask is formed over the n-channel type TFT. Afterwards, the p-channel type impurity elements are added as shown in FIG. 1C. By adopting such steps, the region 11 which is added phosphorus as an n-type impurity element and boron as a p-type impurity element, and the region 12 which is added only boron are formed as shown in FIG. 1E in the p-channel type TFT. The region 11 added phosphorus and boron, which become a counter dope, can be narrowed. Further, the semiconductor layer located below the gate electrode 9 is not added the impurity elements. The semiconductor layer becomes the channel forming region 13.

As mentioned above, the region added both phosphorus (P) and boron (B) is formed in the semiconductor layer of p-channel type TFT as shown in FIG. 1E. This region 11 is made as a gettering sink, and the purpose of the present invention is accomplished.

In addition, in the p-channel type TFT, the n-type impurity elements may added in regions 20 as shown in FIG. 1F using a pattern 18 of the conductive layer (A) and the conductive layer (B). Then, after the pattern 18 is etched so as to form gate electrode 19 as shown in FIG. 1G, p-type impurity elements are added into regions 21a, 21b, and 22. Accordingly, the regions 21a and 21b include both p-type and n-type impurity elements and the region 22 includes only p-type impurity elements. As shown in FIG. 1G, the moving distance of the catalytic element to the gettering sink can be made short when the gettering is performed.

[Embodiment 1]

An embodiment of the present invention will be described with reference to FIGS. 2, 3A to 3B, 4A to 4D, and 5A to 5B. Here, a detailed description is given step by step on a method of manufacturing, on the same substrate, a pixel TFT for a pixel portion and TFTs for a driving circuit provided in the periphery of the pixel portion.

Figure 3A:
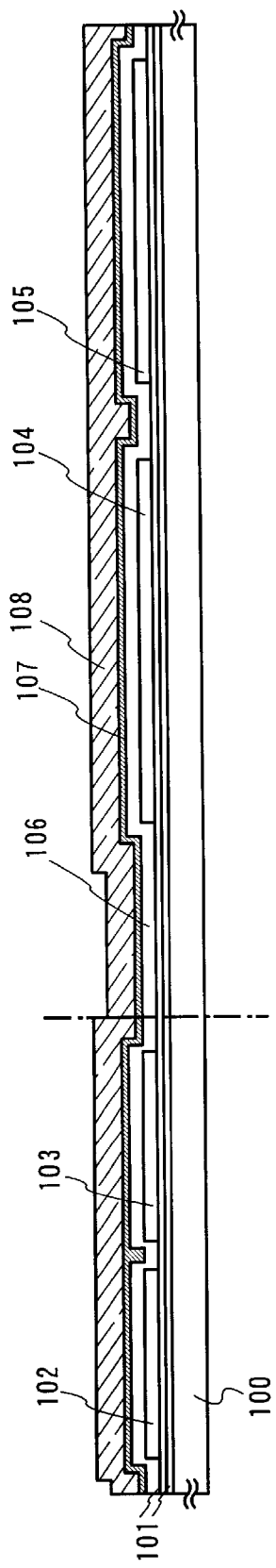
FIGS. 3A and 3B are diagrams showing an embodiment of the present invention.

In FIG. 3A, a low alkaline glass substrate or a quartz substrate may be used for a substrate 100. This embodiment employs a low alkaline glass substrate. In this case, the substrate may be subjected to heat treatment at a temperature 10 to 20° C. lower than the glass distortion point. On a surface of the substrate 100 on which the TFTs are to be formed is covered with a base film 101 in order to prevent diffusion of impurities from the substrate 100. The base film may be a silicon oxide film, a silicon nitride film, a silicon oxynitride film, or the like. For instance, the base film may be laminate of a silicon oxynitride film formed from $SiH_4$, $NH_3$, and $N_2O$ by plasma CVD to a thickness of 100 nm and a silicon oxynitride film formed from $SiH_4$ and $N_2O$ by plasma CVD to a thickness of 200 nm.

Next, a semiconductor film having an amorphous structure is formed to a thickness of 20 to 150 nm (preferably 30 to 80 nm) by a known method such as plasma CVD or sputtering. In this embodiment, an amorphous silicon film with a thickness of 55 nm is formed by plasma CVD. Other semiconductor films having an amorphous structure include microcrystalline semiconductor films. The base film 101 and the amorphous silicon film can be formed by the same film formation method and the two may be formed successively. The surface of the base film is prevented from being contaminated if exposure to the air is avoided after the formation of the base film. Accordingly, fluctuation in characteristic and threshold voltage of the TFTs manufactured can be reduced.

A semiconductor film having a crystal structure (a crystalline silicon film, in this embodiment) is then formed in accordance with the technique disclosed in Japanese Patent Application Laid-open No. Hei 7-130652. The technique described in the publication is a crystallization method that uses a catalytic element for promoting crystallization (one or more kinds of elements selected from the group consisting of Ni, Co, Sn, Pb, Pd, Fe, and Cu. Typically, Ni) in crystallizing the amorphous silicon film.

Specifically, the amorphous silicon film is subjected to heat treatment while the catalytic element is held to the surface of the amorphous silicon film to change it into a crystalline silicon film. This embodiment employs the method described in Embodiment 1 of the publication but the method of Embodiment 2 in the same publication may be used instead. Although crystalline silicon films include a so-called single crystal silicon film and a polysilicon film, the crystalline silicon film formed in this embodiment is a silicon film having crystal grain boundaries.

In doping the amorphous silicon film with the catalytic element, plasma doping, or vapor deposition such as evaporation or sputtering can be employed. Alternatively, a method of applying a solution containing the catalytic element may be employed. The method using a solution is easy to control the dose of the catalytic element, so that doping of a minute amount of catalytic element can easily be made.

The crystallinity of the crystalline semiconductor film can be improved further by using the crystallization method described above in combination with laser crystallization. A laser usable in this case is a pulse oscillation type or continuous wave KrF excimer laser, XeCl excimer laser, YAG laser, or $YVO_4$ laser. Laser light emitted from a laser as those given in the above is collected into a linear beam by an optical system before irradiating the semiconductor film. Conditions for crystallization are suitably set by an operator.

When the amorphous silicon film is crystallized, rearrangement of atoms takes place to densify the film. Therefore the crystalline silicon film obtained has a thickness smaller than the original thickness of the amorphous silicon film (55 nm, in this embodiment) by about 1 to 15%.

The crystalline silicon film is then divided into island-like semiconductor layers 102 to 105.

At this point, the entire surface of the island-like semiconductor layers 102 to 105 for forming the n-channel TFT may be doped with boron (B) as an impurity element for imparting the p-type conductivity in a concentration of $1\times10^{16}$ to $5\times10^{17}$ atoms/cm$^3$ in order to control the threshold voltage. The boron (B) doping may be carried out by ion doping, and it may be conducted while the amorphous silicon film is being formed. The boron (B) doping at this point is not always necessary but the semiconductor layers 102 to 105 are preferably doped with boron (B) in order to contain the threshold voltage in the n-channel TFT in a given range.

A gate insulating film 106 with a thickness of 10 to 150 nm is formed next by plasma CVD or sputtering from an insulating film containing silicon. For example, a silicon oxynitride film is formed to a thickness of 120 nm. The gate insulating film 106 may be a single layer or a laminate of other insulating films containing silicon.

Formed next are a conductive film (A) 107 and a conductive film (B) 108 for forming gate electrodes. In this embodiment, the conductive film (A) 107 is a conductive metal nitride film and the conductive film (B) 108 is a metal film. The film (B) is laid on the film (A) to form a laminate. The conductive film (B) 108 is formed of an element selected from the group consisting of tantalum (Ta), titanium (Ti), molybdenum (Mo), and tungsten (W), or an alloy containing one of the above elements as its main ingredient, or an alloy containing a combination of the above elements (typically, a Mo—W alloy or a Mo—Ta alloy). The conductive film (A) 107 is formed of tantalum nitride (TaN), tungsten nitride (WN), titanium nitride (TiN), or molybdenum nitride (MoN). Alternatively, the conductive film (A) 107 may be formed of tungsten silicide, titanium silicide, or molybdenum silicide. The conductive film (B) 108 preferably contain impurities in low concentration in order to lower its resistivity. In Particular, the oxygen concentration thereof is preferably 30 ppm or less. For example, a tungsten (W) film containing 30 ppm or less oxygen can have a specific resistivity of 20 $\mu\Omega$cm or lower.

The thickness of the conductive film (A) 107 is set to 10 to 50 nm (preferably 20 to 30 nm) whereas the thickness of the conductive film (B) 108 is set to 200 to 400 nm (preferably 250 to 350 nm). In this embodiment, a tantalum nitride film with a thickness of 30 nm is used for the conductive film (A) 107 while a W film with a thickness of 350 nm is used for the conductive film (B) 108, and both films are formed by sputtering. In forming a film by sputtering, an appropriate amount of Xe and Kr added to the sputtering gas of Ar can ease the internal stress of the film to be formed and thus prevent the film from peeling off. Though not shown in the drawing, it is effective to form a silicon film doped with phosphorus (P) to a thickness of about 2 to 20 nm under the conductive film (A) 107. The silicon film improves adhesion of the conductive film formed thereon and prevents oxidization of the conductive film. The silicon film also can prevent a minute amount of alkaline metal element contained in the conductive film (A) 107 or the conductive film (B) 108 from diffusing into the gate insulating film 106. (FIG. 3A)

Masks 109 to 112 are then formed from a resist and first etching treatment is conducted to form gate electrodes and capacitance wiring lines of the respective TFTs. In this embodiment, first etching conditions include employing ICP (inductively coupled plasma) etching, choosing $CF_4$, $Cl_2$, and $O_2$ as etching gas, setting the gas flow rate ratio thereof to 25/25/10 sccm, and giving an RF (13.56 MHz) power of 500 W to a coiled electrode at a pressure of 1 Pa to generate plasma. The substrate side (sample stage) also receives an RF (13.56 MHz) power of 150 W so that a substantially negative self-bias voltage is applied. A W film is etched under these first etching conditions to taper first conductive layers around the edges.

The etching conditions are changed to second etching conditions without removing the masks 109 to 112. The second etching conditions include using $CF_4$ and $Cl_2$ as etching gas, setting the gas flow rate ratio thereof to 30/30 sccm, and giving an RF (13.56 MHz) power of 500 W to a coiled electrode at a pressure of 1 Pa to generate plasma for thirty second etching. The substrate side (sample stage) also receives an RF (13.56 MHz) power of 20 W so that a substantially negative self-bias voltage is applied. Under the second etching conditions using the mixture of $CF_4$ and $Cl_2$, the W film and the TaN film are etched to the same degree. Through the above steps, a gate electrode (A) 113 of the n channel TFT, a gate electrode (C) 114 of the p-channel TFT, gate electrodes (F) 115 of the pixel TFT, and a capacitance wiring line 116 are formed from the conductive film (A) 107 and the conductive film (B) 108 and tapered around the edges. The gate electrode (C) 114 of the p-channel TFT is designed to be larger in size than the gate electrode (A) 113 of the n-channel TFT and the gate electrodes (F) 115 of the pixel TFT. Regions of the gate insulating film 106 that are not covered with the masks 109 to 112 are etched and thinned through the above steps. The gate electrode (A) 113, the gate electrode (C) 114, the gate electrodes (F) 115, and the capacitance wiring line 116 that are formed by the first etching treatment are also referred to as first shape gate electrodes and capacitance wiring line. The gate electrode (C) 114 is later used as a mask in an n-type impurity element doping step so as to prevent a region doped with an n-type impurity element from getting too large in a semiconductor layer of the p-channel TFT. For that reason, the gate electrode (C) 114 is wider than the gate electrode (A) 113 of the n-channel TFT.

Figure 3B:
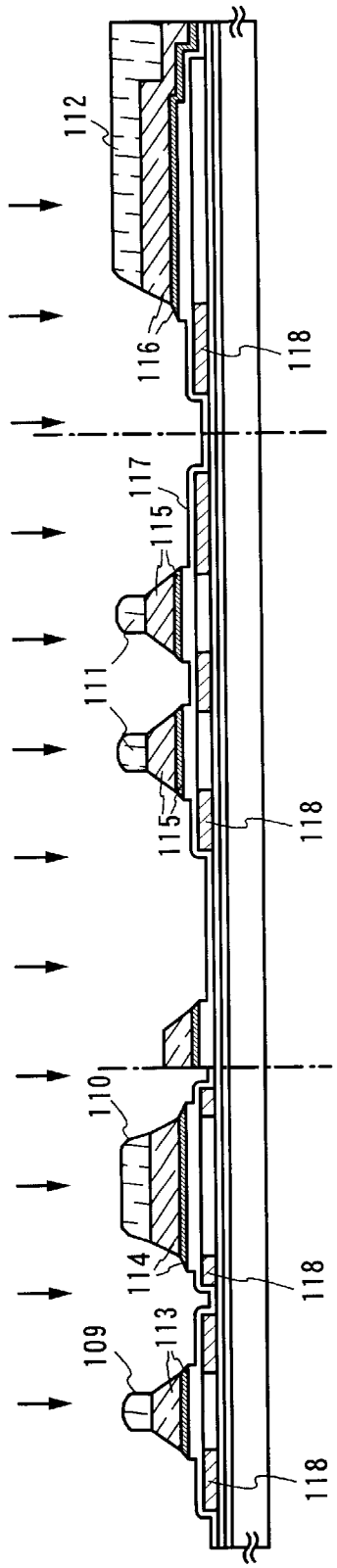

Still leaving the masks 109 to 112 in place, the n-type impurity element doping step is conducted to form an impurity region 118 (FIG. 3B). Phosphorus (P) or arsenic (As) may be used for the n-type impurity element. Here, ion doping using phosphine ($PH_3$) is employed in order to dope the region with phosphorus (P). (FIG. 3B)

Then second etching treatment is conducted without removing the masks 109–112. In the second etching treatment, $CF_4$, $Cl_2$, and $O_2$ are used as etching gas, the gas flow rate ratio thereof is set to 20/20/20 sccm, and an RF (13.56 MHz) power of 500 W is given to a coiled electrode at a pressure of 1 Pa to apply a substantially negative self-bias voltage. The W film is selectively etched in the second etching treatment.

Through the second etching treatment, conductive films (A) 113a, 114a, 115a, and 116a and conductive films (B) 113b, 114b, 115b, and 116b are etched to form a gate electrode (B) 119, a gate electrode (D) 120, gate electrodes (G) 121, and a capacitance wiring line 122. A gate electrode (B) 119 of the n-channel TFT, gate electrodes (G) 121, and a capacitance wiring line 122 are formed into predetermined shapes in this step. On the other hand, a gate electrode (D) 120 of the p-channel TFT is formed to have a size larger than the last shapes of the gate electrode of the p-channel TFT since the gate electrode (D) 120 is used as a mask for reducing the area of the region containing an n-type impurity element in high concentration in the semiconductor layer of the p-channel TFT. Also, the gate electrode (B) 119, the gate electrodes (G) 121, the gate electrode (D) 120, and the capacitance wiring line 122 that are formed by the second etching treatment may be referred to as second shape gate electrodes and capacitance wiring line.

Next, the semiconductor layer is doped with an n-type impurity element. Using as masks a gate electrode (B) 119, a gate electrode (D) 120, and gate electrodes (G) 121 that are formed by the second etching treatment, the semiconductor layers below the tapered portions of the conductive films (A) 119a, 120a, 121a, and 122a are also doped with an n-type impurity element. As a result, n-type impurity regions (A) 123a, 124a, 125a, and 126a and n-type impurity regions (B) 123b, 124b, 125b, 126b, 123c, and 125c are formed. The impurity (phosphorus (P)) concentration in the impurity regions 123a to 126a formed here is set to $1\times10^{20}$ to $1\times10^{21}$ atoms/cm$^3$ (in this specification, the concentration of the n-type impurity element contained in the n-type impurity regions 123a to 126a is expressed as (n$^+$)). The impurity concentration in the n-type impurity regions (B) 123b to 126b is set to $5\times10^{17}$ to $5\times10^{19}$ atoms/cm$^3$ (in this specification, the concentration of the n-type impurity element contained in the n-type impurity regions 123b to 126b is expressed as (n$^-$)). The impurity concentration is slightly low in the n-type impurity region 123c that overlaps the tapered portions of the conductive film (A) 119a, but it has almost the same concentration as the n-type impurity region 123b. (FIG. 4A)

The resist masks 109 to 112 are removed and then a mask 127 is newly formed from a resist to cover the n channel TFT for third etching treatment. In the third etching treatment, $SF_6$ and $Cl_2$ are used as etching gas, the gas flow rate ratio thereof is set to 50/10 sccm, and an RF (13.56 MHz) power of 500 W is given to a coiled electrode at a pressure of 1.3 Pa to generate plasma for thirty second etching. The substrate side (sample stage) receives an RF (13.56 MHz) power of 10 W so that a substantially negative self-bias voltage is applied. Through the above steps, the conductive films (A) 120a and 121a are etched to form a gate electrode (D') 128 of the p-channel TFT and gate electrodes (H) 129 of the pixel TFT. The gate electrode (D') 128 and the gate electrodes (H) 129 that are formed by the third etching treatment are also called third shape gate electrodes. (FIG. 4B)

The resist mask 127 is removed. Formed next are resist masks 130, 131, and 132. (FIG. 4C) The resist mask 130 is used when the gate electrode (D') 128 is etched to have a given size. The resist masks 131 and 132 cover the pixel TFT and the capacitance wiring line. By subjecting the gate electrode (D') 128 of the p-channel TFT to etching treatment, a gate electrode (E) 133 of the p-channel TFT is obtained. The gate electrode (E) formed through this fourth etching treatment is also called a fourth shape gate electrode.

The semiconductor layer of the p-channel TFT is then doped with a p-type impurity element (boron (B), in this embodiment) to form p-type impurity regions 134 to 137. The p-type impurity regions 134 and 136 each contain the p-type impurity elements in a concentration of $2\times10^{20}$ to $2\times10^{21}$ atoms/cm$^3$. In this embodiment, the TaN film above the region of the semiconductor layer of the p-channel TFT which is to be doped with boron (B) is removed before boron (B) doping is performed on the semiconductor layer. Therefore the semiconductor layer can be doped with boron (B) at a low acceleration to damage the layer less upon doping.

Through the above steps, the n-type impurity regions and the p-type impurity regions are formed in the relevant semiconductor regions. (FIG. 4D)

The masks 130 to 132 are then removed to form an inorganic interlayer insulating film 138. A silicon nitride film, a silicon oxide film, or a silicon oxynitride film with a thickness of 50 to 500 nm (typically 100 to 300 nm) is used. In this embodiment, a silicon oxynitride film is formed by plasma CVD to a thickness of 150 nm. The inorganic interlayer insulating film is not limited to the silicon oxynitride film, of course, and it may be a single layer or a laminate of other insulating films containing silicon. (FIG. 5A)

Next, the impurity elements that have been used to dope the semiconductor layers are activated. This activation step employs an annealing furnace. Thermal annealing is conducted in a nitrogen atmosphere with oxygen concentration set to 1 ppm or less, preferably 0.1 ppm or less, at 400 to 700° C., typically 500 to 550° C. In this embodiment, the impurity elements are activated through heat treatment at 550° C. for four hours. Other than thermal annealing, laser annealing or rapid thermal annealing (RTA) can be used.

At the same time the above activation treatment is conducted, this embodiment carries out gettering of the catalytic elements used as a catalyst in crystallization so that the catalytic elements move to the n-type impurity regions containing phosphorus in high concentration and the amount of remaining catalytic element is reduced. The concentration of phosphorus (P) required for gettering is about the same as the concentration in the impurity regions (n$^+$) formed in FIG. 3B. The heat treatment for the activation step is also capable of gettering the catalytic elements to remove them from the channel forming regions of the n-channel TFT and the p-channel TFT. Mostly, an obtained TFT has a reduced OFF current value and excellent crystallinity, and therefore high field effect mobility is obtained and excellent characteristics are attained.

Alternatively, the activation treatment may be conducted before the inorganic interlayer insulating film 138 is formed. However, if the material used for the gate electrodes is weak against heat, the activation treatment is desirably preceded by formation of an interlayer insulating film (insulating film mainly containing silicon, a silicon nitride film, for example) for protecting wiring line and the like as in this embodiment.

Another heat treatment is conducted in an atmosphere containing 3 to 100% hydrogen at 300 to 550° C. for one to twelve hours, thereby hydrogenating the semiconductor layers. In this embodiment, the substrate is subjected to heat treatment in a nitrogen atmosphere containing about 3% of hydrogen at 410° C. for an hour. This step is to terminate dangling bonds in the semiconductor layers by hydrogen contained in the interlayer insulating film. Other hydrogenation methods include plasma hydrogenation (using hydrogen excited by plasma).

If laser annealing is used for the activation treatment, it is desirable to conduct the hydrogenation first and then irradiation of laser light from an excimer laser, a YAG laser, and the like.

Next, an organic interlayer insulating film 139 is formed on the inorganic interlayer insulating film 138 from an organic insulating material. In this embodiment, an acrylic resin film with a thickness of 1.6 μm is formed. Contact holes reaching the respective impurity regions are then formed by patterning.

Thereafter, a transparent conductive film with a thickness of 80 to 120 nm is formed and patterned to form a pixel electrode 140. Examples of a suitable material for the transparent conductive film include an indium oxide-zinc oxide alloy (In$_2$O$_3$—ZnO) and zinc oxide (ZnO). Zinc oxide added with gallium (Ga) (ZnO:Ga) in order to enhance the visible light transmittance or the conductivity may also be used for the transparent conductive film.

In a driving circuit portion 205, wiring lines 141 to 143 electrically connected to the impurity regions are formed. These electrodes are formed by patterning a laminate of a Ti film with a thickness of 50 nm and an alloy (alloy of Al and Ti) film with a thickness of 500 nm.

In a pixel portion 206, wiring lines 144 to 147 are formed and brought into contact with the impurity regions.

The pixel electrode 140 is electrically connected to a semiconductor layer 136 that functions as one of electrodes of a capacitor storage via a wiring 146.

Although the pixel electrode 140 shown in this embodiment comprises a transparent conductive film, a conductive material having reflectivity may be used to form the pixel electrode. Then a reflective display device is obtained. In this case, the pixel electrode can be formed at the same time the other electrodes are formed. A desirable material of the pixel electrode for a reflective display device is a highly reflective material such as a film mainly containing Al or Ag, or a laminate of an Al film and an Ag film.

In this way, the TFTs for the driving circuit and the pixel TFT for the pixel portion can be formed on the same substrate. The driving circuit has an n-channel TFT 201 and a p-channel TFT 202. The pixel portion has a pixel TFT 203 and a capacitor storage 204. A substrate as this is herein referred to as active matrix substrate for conveniences' sake.

Figure 2:
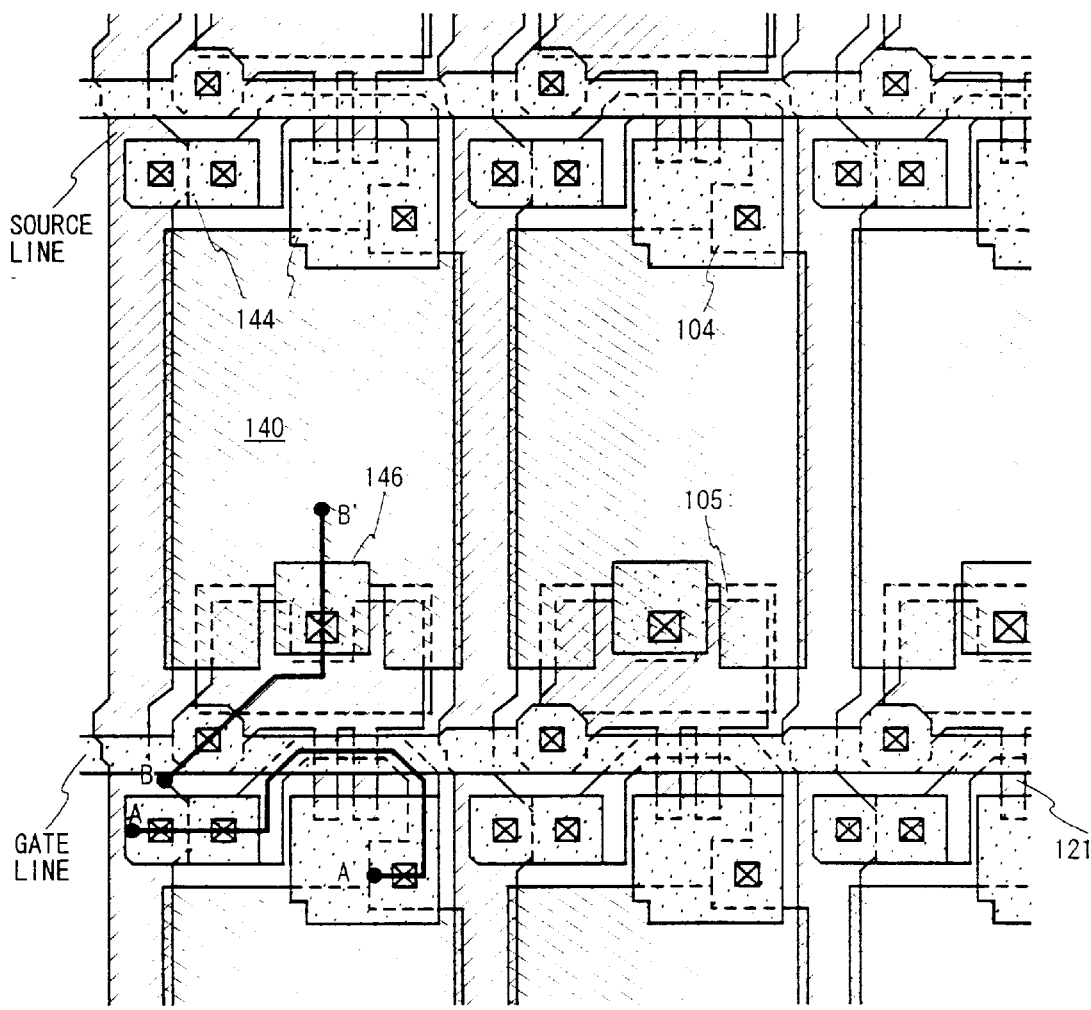
FIG. 2 is a diagram showing an embodiment of the present invention.

The top view of the active matrix substrate is show in FIG. 2. Lines A–A' and B–B' correspond lines A–A' and B–B' in FIG. 5, respectively, and semiconductor layers 104, 105, a gate electrode 121, wirings 144, 146, a pixel electrode 140, source lines, and gate lines are formed thereon.

In FIG. 5B, the n-channel TFT 201 of the driving circuit has, in the island-like semiconductor layer 102, a channel forming region; a source region or a drain region 123a; an impurity region 123b; and an impurity region 123c overlapping the second shape gate electrode (B) 119a (hereinafter an impurity region overlapping a gate electrode is denoted by Lov). The length of the Lov region in the channel length direction is set to 0.5 to 3.0 μm, preferably 1.0 to 1.5 μm. The TFT 201 also has the second shape gate electrode (B) 119 that is formed from the laminate of the conductive film (A) 119a and the conductive film (B) 119b.

The p-channel TFT 202 of the driving circuit has, in the island-like semiconductor layer 103, a channel forming region; a source region or a drain region 124a; and an impurity region 124b. The TFT 202 also has the fourth shape gate electrode (E) 133 that is formed from the laminate of the conductive film (A) 133a and the conductive film (B) 133b.

The pixel TFT 203 of the pixel portion has, in the island-like semiconductor layer 104, a channel forming region; a source region or a drain region 125a; and impurity regions 125b and 125c. The TFT 203 also has the third shape gate electrode (H) 129 that is formed from the laminate of the conductive film (A) 129a and the conductive film (B) 129b.

The capacitor storage 204 is comprised of: the capacitance wiring line 122; an insulating film formed from the same material as the gate insulating film; and the semiconductor layer 105 doped with ap-type impurity element. The pixel TFT 203 in FIGS. 5A and 5B has a double gate structure but it may take a single gate structure or a multigate structure in which a plurality of gate electrodes are provided.

As described above, the present invention can improve the operation performance and the reliability of a semiconductor device by individually optimizing the structure of TFTs that constitute a pixel portion and a driving circuit in accordance with specifications required in these circuits. Furthermore, gate electrodes are formed from a heat resistant conductive material to facilitate activation of LDD regions, source regions, and drain regions, and wiring lines are formed from a low resistivity material to lower the wiring resistance satisfactorily. Therefore the invention can also be applied to a display device having a 4 inch or larger pixel portion (screen size).

[Embodiment 2]

Figure 6:
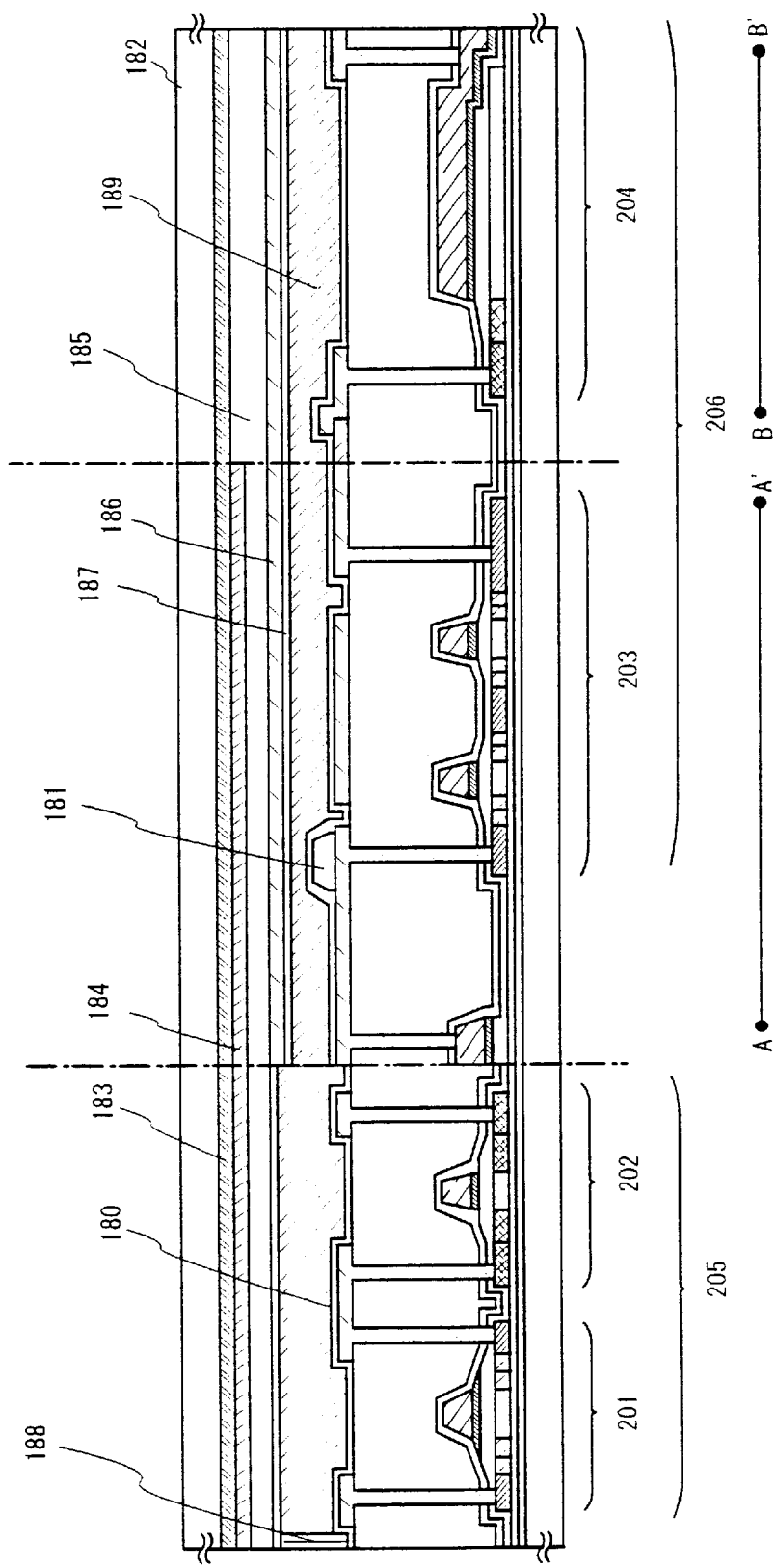
FIG. 6 is a diagram showing an embodiment of the present invention.

In this embodiment, the manufacturing process of an active matrix liquid crystal display device from the active matrix substrate manufactured in Embodiment 1 is described below. FIG. 6 is used for explanation.

First, in accordance with Embodiment 1, the active matrix substrate in a state shown in FIG. 5B is obtained, and thereafter, an alignment film 180 is formed on the active matrix substrate of FIG. 5B, and is subjected to a rubbing process. Note that, in this embodiment, before the formation of the alignment film 180, a columnar spacer for maintaining a gap between the substrates is formed at a desired position by patterning an organic resin film such as an acrylic resin film. Further, spherical spacers may be scattered on the entire surface of the substrate in place of the columnar spacer.

Next, an opposing substrate 182 is prepared. On the opposing substrate 182, there are formed a colored layers 183, 184, and the leveling film 185. Further, the second light shielding portion is formed by overlapping a part of the red color layer 183 and the blue color layer 184. Further, not shown in FIG. 6, the first light shielding portion is formed by overlapping a part of the red color layer and the green color layer.

Next, in the pixel portion an opposing electrode 186 is formed, an alignment film 187 is formed on the entire surface of the opposing substrate, and a rubbing process is conducted thereon.

Then, the active matrix substrate on which a pixel portion and a driving circuit are formed is stuck with the opposing substrate by a sealing agent 188. A filler is mixed in the sealing agent 188, and the two substrates are stuck with each other while keeping a uniform gap by this filler and the columnar spacer. Thereafter, a liquid crystal material 189 is injected between both the substrates to encapsulate the substrates completely by an encapsulant (not shown). A known liquid crystal material may be used as the liquid crystal material 189. Thus, the active matrix liquid crystal display device shown in FIG. 6 is completed. Then, if necessary, the active matrix substrate and the opposing substrate are parted into desired shapes. In addition, by using a known technique, a phase difference plate, a polarizing plate or the like may be suitably provided. Then, an FPC is stuck with the substrate using a known technique.

The structure of the liquid crystal display panel obtained in this way is described using the top view of FIG. 7. In FIG. 7, the same symbols are used for the parts corresponding to those in FIG. 6.

Figure 7A:
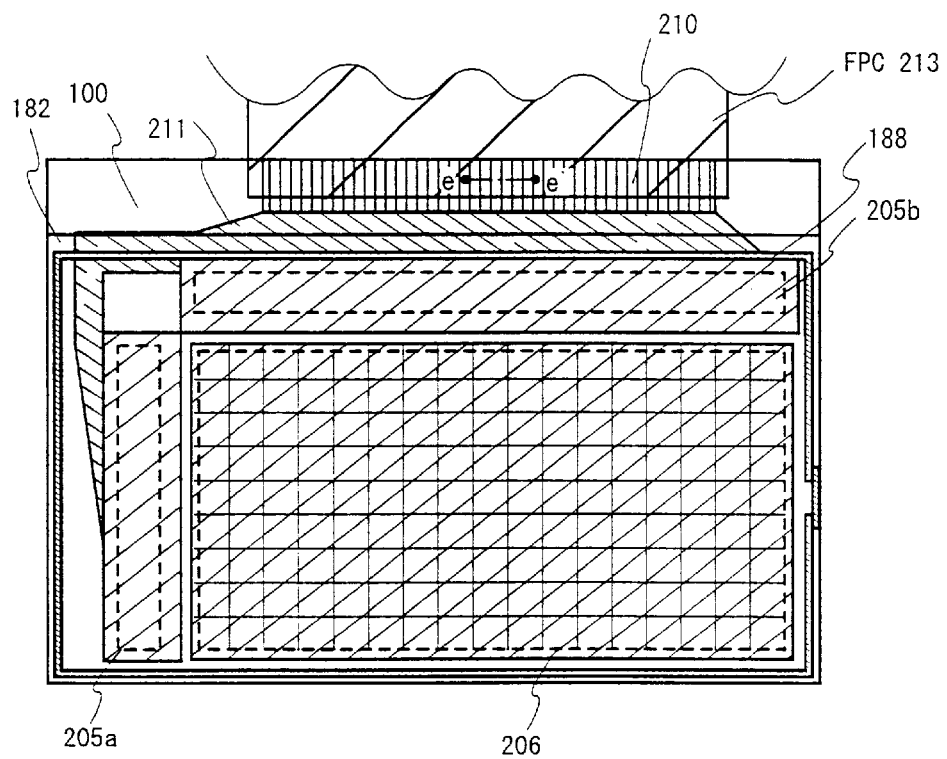
FIGS. 7A and 7B are diagrams showing an embodiment of the present invention.

In the top view shown in FIG. 7A, the active matrix substrate provided with an external input terminal 210 for adhering the pixel portion 206, the driving circuits 205a and 205b and the FPC (flexible printed circuit), a wiring 211 connecting the external input terminal to the input portion of each circuit, and the like, and the opposing substrate 182 provided with color filters and the like are adhered by the sealing agent 188.

Figure 7B:
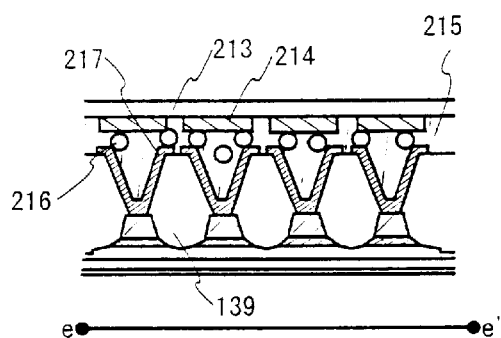

FIG. 7B is a cross sectional view of the external input terminal 210 shown in FIG. 7A along the line e–e'. Further, in the external input terminal, FPC formed by a base film 213 and a wiring 214 are adhered through an anisotropic conductive resin 215. Further the mechanical strength is increased by a reinforcing plate.

The reference numeral 217 is a wiring from a conductive film which is deposited to form the pixel electrode 140. Since the outer diameter of the conductive particle 216 is smaller than the pitch of a wiring 217, if an appropriate amount of conductive particle 216 are dispersed in the adhesive agent 215, short circuit does not occur with the adjacent wirings, and an electrical connection with a corresponding wiring on the FPC side may be formed.

The liquid crystal display panel formed as described above may be used as a display portion of various electric equipment.

[Embodiment 3]

This embodiment describes a method of manufacturing a semiconductor device, which is different from those in Embodiment 1.

Following the steps shown in Embodiment 1, the gate electrode (E) 133 is formed in the third etching step. Thereafter, the gate electrode (B) 119, the gate electrode (E) 133, the gate electrode (H) 129, and the capacitance wiring line 122 that are formed in the previous steps are used as masks to etch regions of the gate insulating film 117 that do not overlap the gate electrodes (and the capacitance wiring line).

Etching the gate insulating film here facilitates doping of impurity elements because it eliminates the need to consider the thickness of the gate insulating film which otherwise would be varied widely in places by the numerous etching steps for the gate electrodes. This embodiment may be combined with Embodiment 1 or 2.

[Embodiment 4]

Figure 8:
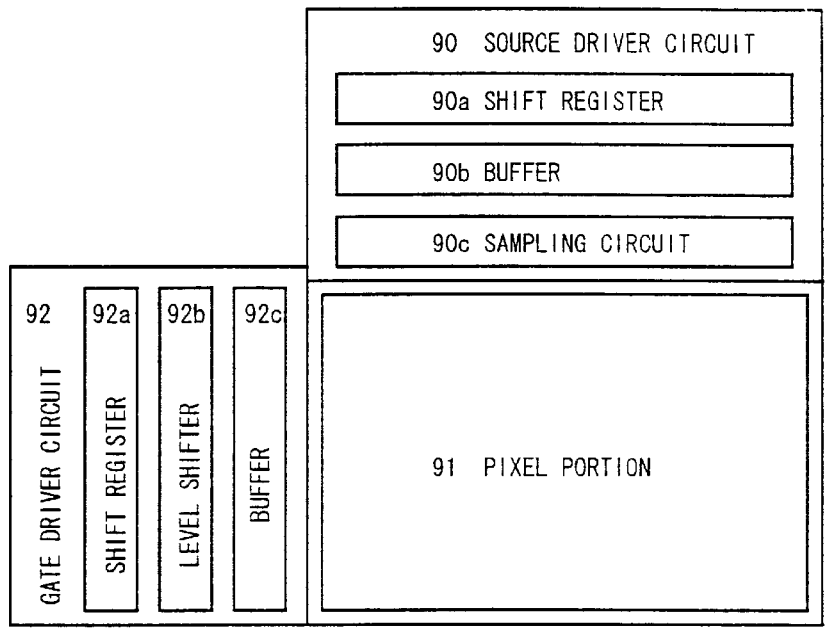
FIG. 8 is a diagram showing an embodiment of the present invention.

FIG. 8 is a block diagram of a semiconductor device manufactured in accordance with the present invention. Shown in FIG. 8 is the circuit structure for analog driving. This embodiment describes a semiconductor device having a source side driving circuit 90, a pixel portion 91, and a gate side driving circuit 92. In this specification, the term driving circuit generically refers to a source side driving circuit and a gate side driving circuit.

The source side driving circuit 90 is provided with a shift register 90a, a buffer 90b, and a sampling circuit (transfer gate) 90c. The gate side driving circuit 92 is provided with a shift register 92a, a level shifter 92b, and a buffer 92c. A level shifter circuit may be provided between the sampling circuit and the shift register if necessary.

In this embodiment, the pixel portion 91 is composed of a plurality of pixels and each of the plural pixels has a TFT element.

Though not shown in the drawing, another gate side driving circuit may be provided across the pixel portion 91 from the gate side driving circuit 92.

Figure 9:
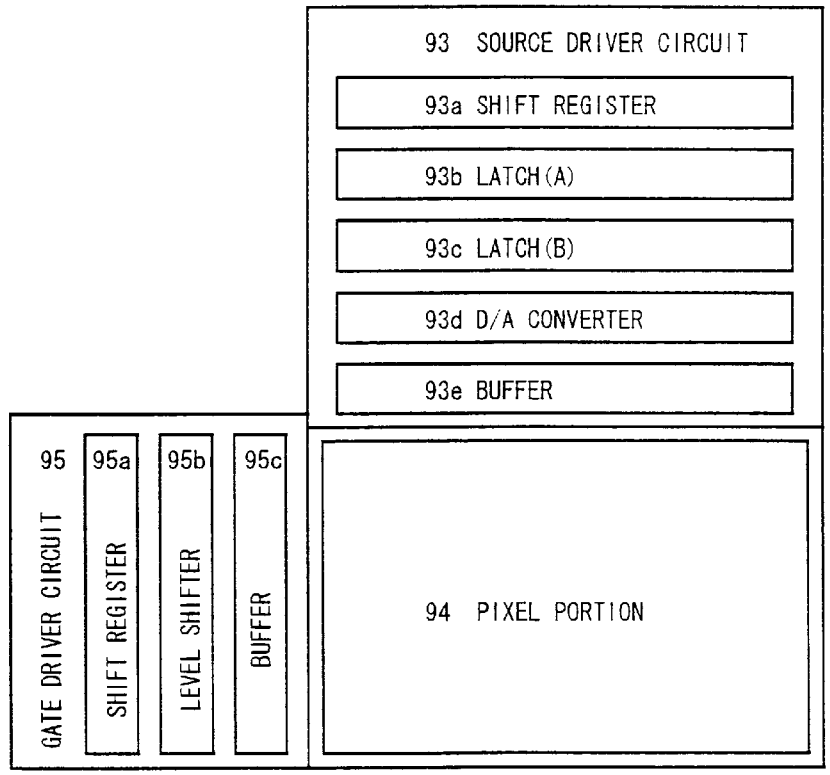
FIG. 9 is a diagram showing an embodiment of the present invention.

If the semiconductor device is digitally driven, the sampling circuit is replaced by a latch (A) 93b and a latch (B) 93c as shown in FIG. 9. A source side driving circuit 93 has a shift register 93a, the latch (A) 93b, the latch (B) 93c, a D/A converter 93d, and a buffer 93e. A gate side driving circuit 95 has a shift register 95a, a level shifter 95b, and a buffer 95c. A level shifter circuit may be provided between the latch (B) 93c and the D/A converter 93d if necessary.

The above structure can be obtained by the manufacture process shown in Embodiment 1. Although only structures of the pixel portion and the driving circuit are described in this embodiment, a manufacture process according to the present invention can form a memory and a microprocessor as well.

[Embodiment 5]

The CMOS circuit and the pixel portion formed by implementing the present invention can be used in various semiconductor apparatus, (typically active matrix type liquid crystal display). That is, the present invention can be implemented in all of electronic apparatus integrated with the semiconductor apparatus at display portions thereof.

As such electronic apparatus, there are pointed out a video camera, a digital camera, a projector (rear type or front type), a head mount display (goggle type display), a personal computer, a portable information terminal (mobile computer, portable telephone or electronic book) and the like. Examples of these are shown in FIGS. 10, 11 and 12.

FIG. 10A shows a personal computer including a main body 2001, an image input portion 2002, a display portion 2003 and a keyboard 2004. The invention is applicable to the image input portion 2002 and the display portion 2003 and other signal control circuits.

FIG. 10B shows a video camera including a main body 2101, a display portion 2102, a voice input portion 2103, operation switches 2104, a battery 2105 and an image receiving portion 2106. The invention is applicable to the display portion 2102 and other digital control circuits.

FIG. 10C shows a mobile computer including a main body 2201, a camera portion 2202, an image receiving portion 2203, an operation switch 2204 and a display portion 2205. The invention is applicable to the display portion 2205 and other signal control circuits.

FIG. 10D shows a goggle type display including a main body 2301, a display portion 2302 and an arm portion 2303. The invention is applicable to the display portion 2302 and other signal control circuits.

FIG. 10E shows a player using a record medium recorded with programs (hereinafter, referred to as record medium) including a main body 2401, a display portion 2402, a speaker portion 2403, a record medium 2404 and an operation switch 2405. The player uses DVD (digital Versatile Disc) or CD as the record medium and can enjoy music, enjoy movie and carry out game or Internet. The invention is applicable to the display portion 2402 and other signal control circuits.

FIG. 10F shows a digital camera including a main body 2501, a display portion 2502, an eye contact portion 2503, operation switches 2504 and an image receiving portion (not illustrated). The invention is applicable to the display portion 2502 and other signal control circuits.

Figure 11A:
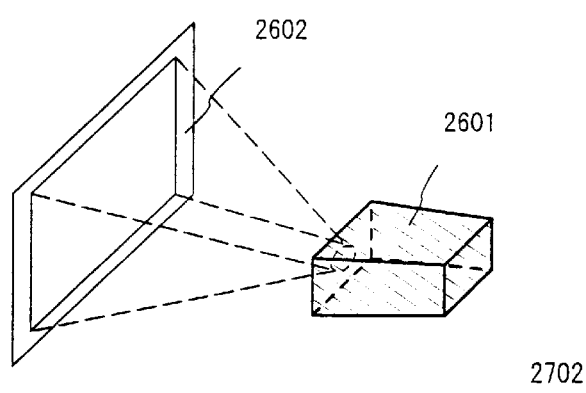
FIGS. 11A to 11D are diagrams showing examples of an electric appliance that employs as a display unit a semiconductor device manufactured in accordance with the present invention.

FIG. 11A shows a front type projector including a projection apparatus 2601 and a screen 2602. The invention is applicable to a liquid crystal display apparatus 2808 constituting a portion of the projection apparatus 2601 and other signal control circuits.

Figure 11B:
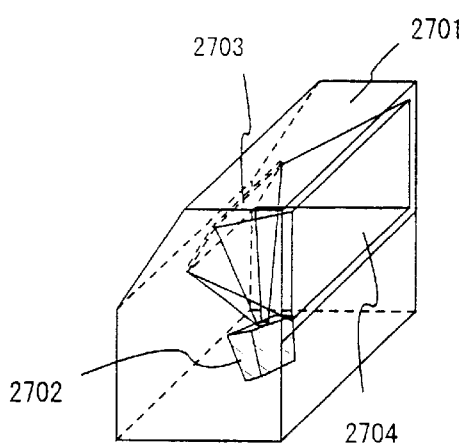

FIG. 11B shows a rear type projector including a main body 2701, a projection apparatus 2702, a mirror 2703 and a screen 2704. The invention is applicable to a signal control circuit of the liquid crystal display apparatus 2808 constituting a portion of the projection apparatus 2702 and other driving circuits.

Figure 11C:
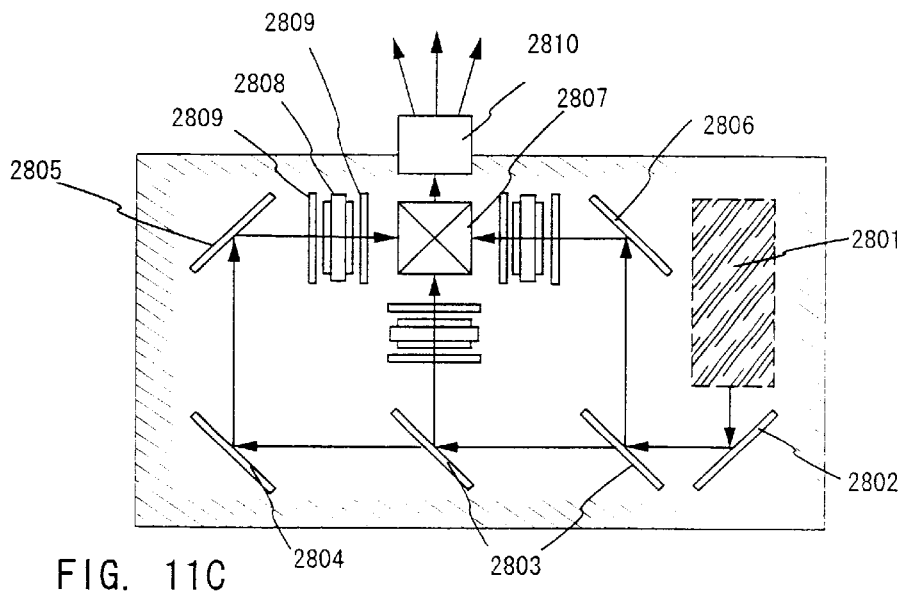

Further, FIG. 11C is a view showing an example of a structure of the projection apparatus 2601 and 2702 in FIG. 11A and FIG. 11B. The projection apparatus 2601 or 2702 is constituted by a light source optical system 2801, mirrors 2802, and 2804 through 280, dichroic mirrors 2803, a prism 2807, a liquid crystal display apparatus 2808, phase difference plates 2809 and a projection optical system 2810. The projection optical system 2810 is constituted by an optical system including a projection lens. Although the embodiment shows an example of three plates type, the embodiment is not particularly limited thereto but may be of, for example, a single plate type. Further, person of executing the embodiment may pertinently provide an optical system such as an optical lens, a film having a polarization function, a film for adjusting a phase difference or an IR film in an optical path shown by arrow marks in FIG. 11C.

Figure 11D:
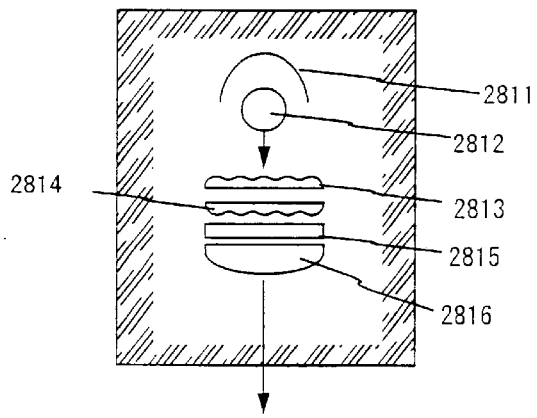

Further, FIG. 11D is a view showing an example of a structure of the light source optical system 2801 in FIG. 11C. According to the embodiment, the light source optical system 2801 is constituted by a reflector 2811, a light source 2812, lens arrays 2813 and 2814, a polarization conversion element 2815 and a focusing lens 2816. Further, the light source optical system shown in FIG. 11D is only an example and the embodiment is not particularly limited thereto. For example, a person of executing the embodiment may pertinently provide an optical system such as an optical lens, a film having a polarization function, a film for adjusting a phase difference or an IR film in the light source optical system.

However, according to the projectors shown in FIGS. 11A and 11B, there is shown a case of using a transmission type electro-optic apparatus and an example of applying a reflection type electro-optic apparatus is not illustrated.

Figure 12A:
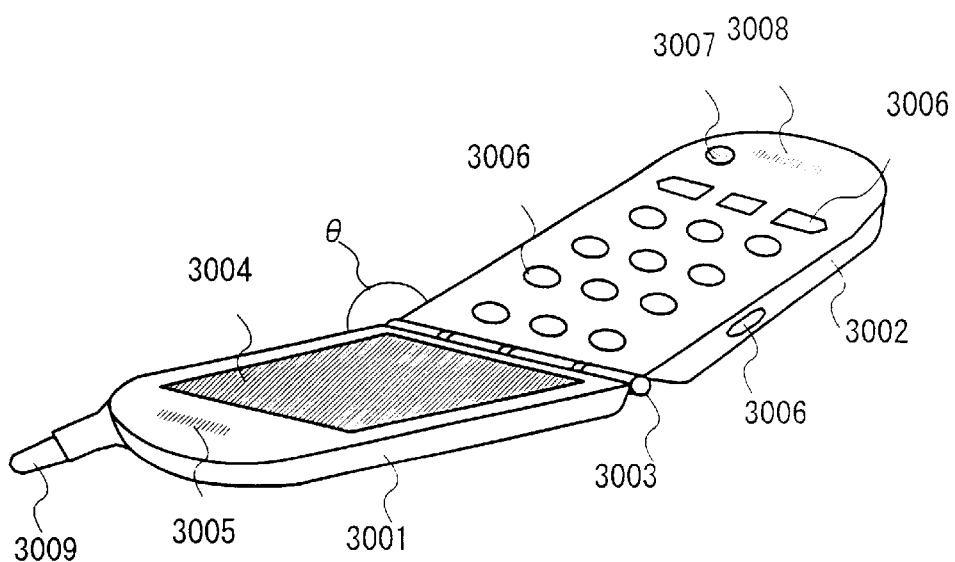
FIGS. 12A to 12C are diagrams showing examples of an electric appliance that employs as a display unit a semiconductor device manufactured in accordance with the present invention.

FIG. 12A shows a portable telephone including a display panel 3001, an operation panel 3002. The display panel 3001 and the operation panel 3002 is connected to each other in the connecting portion 3003. In the connecting portion 3003, the angle of a face which is provided the display portion 3004 of the display panel 3001 and a face which is provided the operation key 3006 of the operation panel 3002 can be changed arbitrary. Further, a voice output portion 3005, an operation key 3006, a power source switch 3007 and a sound input portion 3008 are also included. The invention is applicable to the display portion 3004.

Figure 12B:
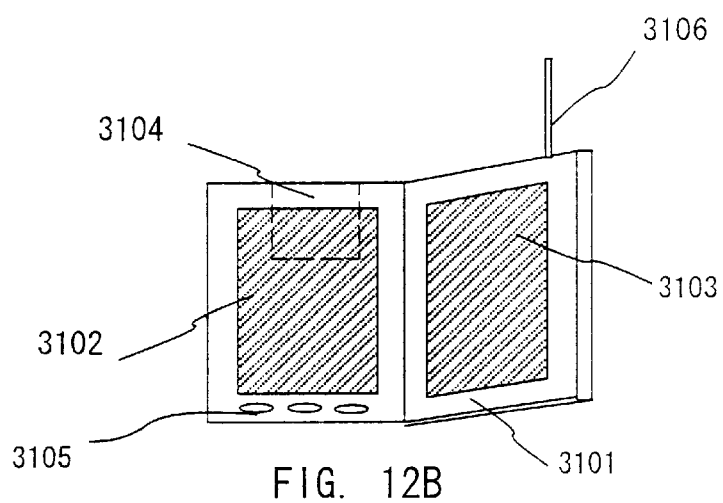

FIG. 12B shows a portable book (electronic book) including a main body 3101, display portion 3102, 3103, a record medium 3104, an operation switch 3105 and an antenna 3106. The invention is applicable to the display portion 3102, 3103 and other signal control circuits.

Figure 12C:
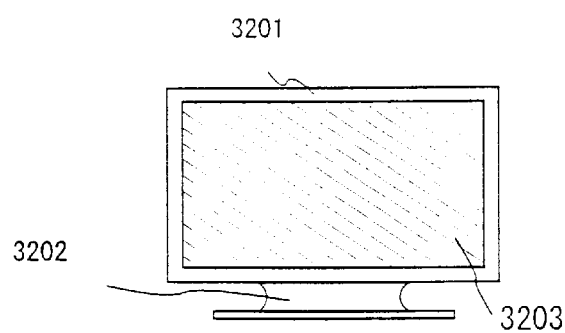

FIG. 12C shows a display including a main body 3201, a support base 3202 and a display portion 3203. The invention is applicable to the display portion 3203. The display according to the invention is advantageous particularly in the case of large screen formation and is advantageous in the display having a diagonal length of 10 inch or more (particularly, 30 inch or more).

As has been described, the range of applying the invention is extremely wide and is applicable to electronic apparatus of all the fields. The electronic apparatus of the present invention can be implemented by freely combined with Embodiments 1 to 4.

According to the present invention, a satisfactory gettering can be performed on a semiconductor layer of a p-channel TFT without increasing the number of masks and steps to thereby reduce the resistance in a source region and a drain region. The satisfactory gettering decreases the adverse effect of a catalytic element, and therefore a highly reliable p-channel TFT can be manufactured by a simpler procedure with high yield.

What is claimed is:

1. A method of manufacturing an electrical device, comprising steps of:
   forming an amorphous semiconductor layer on an insulating surface;
   providing the amorphous semiconductor layer with a catalytic element for promoting crystallization;
   heating the amorphous semiconductor layer provided with the catalytic element to obtain a crystalline semiconductor layer;
   forming a gate insulating film on the crystalline semiconductor layer;

forming a conductive film on the gate insulating film;

etching the conductive film to form a gate electrode of an n-channel TFT and to form a conductive pattern of a p-channel TFT;

doping the semiconductor layer with an n-type impurity element while using the gate electrode and the conductive pattern as masks;

etching the conductive pattern to form a gate electrode of the p-channel TFT while covering a region that is used for the n-channel TFT with a resist mask; and doping the semiconductor layer in the p-channel TFT with a p-type impurity element.

2. A method of manufacturing an electrical device, comprising steps of:

forming an amorphous semiconductor layer on an insulating surface;

providing the amorphous semiconductor layer with a catalytic element for promoting crystallization;

heating the amorphous semiconductor layer provided with the catalytic element and then irradiating the semiconductor layer with a laser to obtain a crystalline semiconductor layer;

forming a gate insulating film on the crystalline semiconductor layer;

forming a conductive film on the gate insulating film;

etching the conductive film to form a gate electrode of an n-channel TFT and to form a conductive pattern of a p-channel TFT;

doping the semiconductor layer with an n-type impurity element while using the gate electrode and the conductive pattern as masks;

etching the conductive pattern to form a gate electrode of the p-channel TFT while covering a region that is used of the n-channel TFT with a resist mask; and doping the semiconductor layer in the p-channel TFT with a p-type impurity element.

3. A method according to claim 2, wherein the laser is selected from the group consisting of a pulse oscillation type KrF excimer laser, XeCl excimer laser, YAG laser, and $YVO_4$ laser.

4. A method of manufacturing an electrical device, comprising steps of:

forming an amorphous semiconductor layer on an insulating surface;

providing the amorphous semiconductor layer with a catalytic element for promoting crystallization;

heating the amorphous semiconductor layer provided with the catalytic element to obtain a crystalline semiconductor layer;

forming a gate insulating film on the crystalline semiconductor layer;

forming a first conductive film on the gate insulating film and a second conductive film on the first conductive film;

etching the first conductive film and the second conductive film to form first shape gate electrodes;

doping the semiconductor layer with an n-type impurity element while using the first shape gate electrodes as masks;

etching the first shape gate electrodes to form second shape gate electrodes;

doping the semiconductor layer with an n-type impurity element while using the second shape gate electrodes as masks;

etching the second shape gate electrodes to form third shape gate electrodes;

etching the third shape gate electrodes to form fourth shape gate electrodes narrower than the third shape gate electrodes; and doping the semiconductor layer in a p-channel TFT with a p-type impurity element while using the fourth shape gate electrodes as masks.

5. A method of manufacturing an electrical device, comprising steps of:

forming an amorphous semiconductor layer on an insulating surface;

providing the amorphous semiconductor layer with a catalytic element for promoting crystallization;

heating the amorphous semiconductor layer provided with the catalytic element and then irradiating the amorphous semiconductor layer with a laser to obtain a crystalline semiconductor layer;

forming a gate insulating film on the crystalline semiconductor layer;

forming a first conductive film on the gate insulating film and a second conductive film on the first conductive film;

etching the first conductive film and the second conductive film to form first shape gate electrodes;

doping the semiconductor layer with an n-type impurity element while using the first shape gate electrodes as masks;

etching the first shape gate electrodes to form second shape gate electrodes;

doping the semiconductor layer with an n-type impurity element while using the second shape gate electrodes as masks;

etching second shape gate electrodes to form third shape gate electrodes;

etching the third shape gate electrodes to form a fourth shape gate electrodes narrower than the third shape gate electrodes; and doping the semiconductor layer in a p-channel TFT with a p-type impurity element while using the fourth shape gate electrodes as masks.

6. A method according to claim 5, wherein the laser is selected from the group consisting of a pulse oscillation type KrF excimer laser, XeCl excimer laser, YAG laser, and $YVO_4$ laser.

7. A method of manufacturing an electrical device, comprising steps of:

forming an amorphous semiconductor layer on an insulating surface;

providing the amorphous semiconductor layer with a catalytic element for promoting crystallization;

heating the amorphous semiconductor layer provided with the catalytic element to obtain a crystalline semiconductor layer;

forming a gate insulating film on the crystalline semiconductor layer;

forming a first conductive film on the gate insulating film and a second conductive film on the first conductive film;

etching the first conductive film and the second conductive film to form a first gate electrode and a second gate electrode;

doping the semiconductor layer with an n-type impurity element while using the first gate electrode and the second gate electrode as masks;

etching the first gate electrode and the second gate electrodes to form a third gate electrode of an n-channel TFT and a fourth gate electrode;

doping the semiconductor layer with an n-type impurity element while using the third gate electrode and the fourth gate electrode as masks;

etching the fourth gate electrode to form a fifth gate electrode of a p-channel TFT while covering the n-channel TFT with a resist mask; and doping the semiconductor layer in the p-channel TFT with a p-type impurity element while using the fifth gate electrode as a mask.

8. A method according to claim 7, wherein each of the third gate electrode and the fifth gate electrode comprises the first conductive film and the second conductive film, and the first conductive film is wider than the second conductive film.

9. A method of manufacturing an electrical device, comprising steps of:

forming an amorphous semiconductor layer on an insulating surface;

providing the amorphous semiconductor layer with a catalytic element for promoting crystallization;

heating the amorphous semiconductor layer provided with the catalytic element and then irradiating the amorphous semiconductor layer with a laser to obtain a crystalline semiconductor layer;

forming a gate insulating film on the crystalline semiconductor layer;

forming a first conductive film on the gate insulating film and a second conductive film on the first conductive film;

etching the first conductive film and the second conductive film to form a first gate electrode and a second gate electrode;

doping the semiconductor layer with an n-type impurity element while using the first gate electrode and the second gate electrode as masks;

etching the first gate electrode and the second gate electrode to form a third gate electrode of an n-channel TFT and a fourth gate electrode;

doping the semiconductor layer with an n-type impurity element while using the third gate electrode and the fourth gate electrode as masks;

etching the fourth gate electrode to form a fifth gate electrode of a p-channel TFT while covering the n-channel TFT with a resist mask; and doping the semiconductor layer in the p-channel TFT with a p-type impurity element while using the fifth gate electrode as a mask.

10. A method according to claim 9, wherein each of the third gate electrode and the fifth gate electrode comprises the first conductive film and the second conductive film, and the first conductive film is wider than the second conductive film.

11. A method according to claim 9, wherein the laser is selected from the group consisting of a pulse oscillation type KrF excimer laser, XeCl excimer laser, YAG laser, and $YVO_4$ laser.

12. A method of manufacturing an electrical device, comprising steps of:

forming an amorphous semiconductor layer with on an insulating surface;

providing the amorphous semiconductor layer with a catalytic element for promoting crystallization;

heating the amorphous semiconductor layer provided with the catalytic element to obtain a crystalline semiconductor layer;

forming a gate insulating film on the crystalline semiconductor layer;

forming a first conductive film on the gate insulating film and a second conductive film on the first conductive film;

etching the first conductive film and the second conductive film to form a first gate electrode, a second gate electrode, and a third gate electrode;

doping the semiconductor layer with an n-type impurity element while using the first gate electrode, the second gate electrode, and the third gate electrode as masks;

etching the first gate electrode, the second gate electrode, and the third gate electrode to form a fourth gate electrode of an n-channel TFT in a driver circuit, a fifth gate electrode, and a sixth gate electrode;

doping the semiconductor layer with an n-type impurity element while using the fourth gate electrode, the fifth gate electrode, and the sixth gate electrode as masks;

etching the fifth gate electrode and the sixth gate electrode to form a seventh gate electrode and an eighth gate electrode of a pixel TFT, respectively, while covering with a resist mask the n-channel TFT that is formed in the driving circuit;

etching the seventh gate electrode to form a ninth gate electrode of a p-channel TFT in the driver circuit; and doping the semiconductor layer in the p-channel TFT with a p-type impurity element while using the ninth gate electrode as a mask.

13. A method according to claim 12, wherein each of the fourth gate electrode, the eighth gate electrode, and the ninth gate electrode comprises the first conductive film and the second conductive film, and the first conductive film is wider than the second conductive film.

14. A method of manufacturing an electrical device, comprising steps of:

forming an amorphous semiconductor layer on an insulating surface;

providing the amorphous semiconductor layer with a catalytic element for promoting crystallization;

heating the amorphous semiconductor layer provided with the catalytic element to obtain a crystalline semiconductor layer;

forming a gate insulating film on the crystalline semiconductor layer;

forming a first conductive film on the gate insulating film and a second conductive film on the first conductive film;

etching the first conductive film and the second conductive film to form a first gate electrode, a second gate electrode, and a third gate electrode;

doping the semiconductor layer with an n-type impurity element while using the first gate electrode, the second gate electrode, and the third gate electrode as masks;

etching the first gate electrode, the second gate electrode, and the third gate electrode to form a fourth gate electrode of an n-channel TFT in a driver circuit, a fifth gate electrode, and a sixth gate electrode;

doping the semiconductor layer with an n-type impurity element while using the fourth gate electrode, the fifth gate electrode, and the sixth gate electrode as masks;

etching the fifth gate electrode and the sixth gate electrode to form a seventh gate electrode and an eighth gate electrode of a pixel TFT, respectively, while covering with a resist mask the n-channel TFT that is formed in the driving circuit;

etching the seventh gate electrode to form a ninth gate electrode of a p-channel TFT in the driver circuit;

doping the semiconductor layer in the p-channel TFT with a p-type impurity element while using the ninth ate electrode as a mask;

subjecting to heat treatment;

covering an entire surface with an organic interlayer insulating film;

forming an organic interlayer insulating film on the inorganic interlayer insulating film;

forming a contact hole reaching the semiconductor layer through the inorganic interlayer insulating film and the inorganic interlayer insulating film;

forming a pixel electrode on the organic interlayer insulating film; and forming a connection wiring line.

15. A method according to claim 14, wherein each of the fourth gate electrode, the eighth gate electrode, and the ninth gate electrode comprises the first conductive film and the second conductive film, and the first conductive film is wider than the second conductive film.

16. A method of manufacturing an electrical device, comprising steps of:

forming an amorphous semiconductor layer on an insulating surface;

providing the amorphous semiconductor layer with a catalytic element for promoting crystallization;

heating the amorphous semiconductor layer provided with the catalytic element to obtain a crystalline semiconductor layer;

forming a gate insulating film on the crystalline semiconductor layer;

forming a first conductive film on the gate insulating film and a second conductive film on the first conductive film;

etching the first conductive film and the second conductive film to form a first gate electrode, a second gate electrode, and a third gate electrode;

doping the semiconductor layer with an n-type impurity element while using the first gate electrode, the second gate electrode, and the third gate electrode as masks;

etching the first gate electrode, the second gate electrode, and the third gate electrode to form a fourth gate electrode of an n-channel TFT in a driver circuit, a fifth gate electrode, and a sixth gate electrode;

doping the semiconductor layer with an n-type impurity element while using the fourth gate electrode, the fifth gate electrode, and the sixth gate electrode as masks;

etching the fifth gate electrode and the sixth gate electrode to form a seventh gate electrode and an eighth gate electrode of a pixel TFT, respectively, while covering with a resist mask an n-channel TFT that is formed in the driving circuit;

etching the seventh gate electrode to form a ninth gate electrode of a p-channel TFT in a driver circuit;

doping the semiconductor layer in the p-channel TFT with a p-type impurity element while using the ninth gate electrode as a mask;

covering an entire surface with an inorganic interlayer insulating film;

gettering the catalytic element through a heat treatment;

forming an organic interlayer insulating film on the inorganic interlayer insulating film;

forming a contact hole reaching the semiconductor layer through the inorganic interlayer insulating film and the organic interlayer insulating film;

forming a pixel electrode on the organic interlayer insulating film; and forming a connection wiring line.

17. A method according to claim 16, wherein each of the fourth gate electrode, the eighth gate electrode, and the ninth gate electrode comprises the first conductive film and the second conductive film, and the first conductive film is wider than the second conductive film.

18. A method of manufacturing an electrical device, comprising steps of:

forming an amorphous semiconductor layer on an insulating surface;

providing the amorphous semiconductor layer with a catalytic element for promoting crystallization;

heating the amorphous semiconductor layer provided with the catalytic element and then irradiating the semiconductor layer with a laser to obtain a crystalline semiconductor layer;

forming a gate insulating film on the crystalline semiconductor layer;

forming a first conductive film on the gate insulating film and a second conductive film on the first conductive film;

etching the first conductive film and the second conductive film to form a first gate electrode, a second gate electrode, and a third gate electrode;

doping the semiconductor layer with an n-type impurity element while using the first gate electrode, the second gate electrode, and the third gate electrode as masks;

etching the first gate electrode, the second gate electrode, and the third gate electrode to form a fourth gate electrode of an n-channel TFT in a driving circuit, a fifth gate electrode, and a sixth gate electrode;

doping the semiconductor layer with an n-type impurity element while using the fourth gate electrode, the fifth gate electrode, and the sixth gate electrode as masks;

etching the fifth gate electrode and the sixth gate electrode to form a seventh gate electrode and an eighth gate electrode of a pixel TFT, respectively, while covering with a resist mask the n-channel TFT that is formed in a driving circuit;

etching the seventh gate electrode to form a ninth gate electrode of an p-channel TFT in a driving circuit;

doping the semiconductor layer in the p-channel TFT with a p-type impurity element while using the ninth gate electrode as a mask;

subject to heat treatment;

covering an entire surface with an inorganic interlayer insulating film;

forming an organic interlayer insulating film on the inorganic interlayer insulating film;

forming a contact hole reaching the semiconductor layer through the inorganic interlayer insulating film and the organic interlayer insulating film;

forming a pixel electrode on the organic interlayer insulating film; and forming a connection wiring line.

19. A method according to claim 18, wherein each of the fourth gate electrode, the eighth gate electrode, and ninth the gate electrode comprises the first conductive film and the second conductive film, and the first conductive film is wider than the second conductive film.

20. A method according to claim 18, wherein the laser is selected from the group consisting of a pulse oscillation type KrF excimer laser, XeCl excimer laser, YAG laser, and YVO$_4$ laser.

21. A method of manufacturing an electrical device, comprising steps of:
   forming an amorphous semiconductor layer on an insulating surface;
   providing the amorphous semiconductor layer with a catalytic element for promoting crystallization;
   heating the amorphous semiconductor layer provided with the catalytic element and then irradiating the semiconductor layer with a laser to obtain a crystalline semiconductor layer;
   forming a gate insulating film on the crystalline semiconductor layer;
   forming a first conductive film on the gate insulating film and a second conductive film on the first conductive film;
   etching the first conductive film and the second conductive film to form a first gate electrode, a second gate electrode, and a third gate electrode;
   doping the semiconductor layer with an n-type impurity element while using the first gate electrode, the second gate electrode, and the third gate electrode as masks;
   etching the first gate electrode, the second gate electrode, and the third gate electrode to form a fourth gate electrode of an n-channel TFT in a driving circuit, a fifth gate electrode, and a sixth gate electrode;
   doping the semiconductor layer with an n-type impurity element while using the fourth gate electrode, the fifth gate electrode, and the sixth gate electrode as masks;
   etching the fifth gate electrode and the sixth gate electrode to form a seventh gate electrode and an eighth gate electrode of a pixel TFT, respectively, while covering with a resist mask the n-channel TFT that is formed in a driving circuit;
   etching the seventh gate electrode to form a ninth gate electrode of a p-channel TFT in the driving circuit;
   doping the semiconductor layer in the p-channel TFT with a p-type impurity element while using the ninth gate electrode as a mask;
   covering an entire surface with an inorganic interlayer insulating film;
   gettering the catalytic element through heat treatment;
   forming an organic interlayer insulating film on the inorganic interlayer insulating film;
   forming a contact hole reaching the semiconductor layer through the inorganic interlayer insulating film and the organic interlayer insulating film;
   forming a pixel electrode on the organic interlayer insulating film; and
   forming a connection wiring line.

22. A method according to claim 21, wherein each of the fourth gate electrode, the eighth gate electrode, and the ninth gate electrode comprises the first conductive film and the second conductive film, and the first conductive film is wider than the second conductive film.

23. A method according to claim 21, wherein the laser is selected from the group consisting of a pulse oscillation type KrF excimer laser, XeCl excimer laser, YAG laser, and YVO$_4$ laser.

24. A method of manufacturing an electrical device, comprising steps of:
   forming an amorphous semiconductor layer on an insulating surface;
   providing the amorphous semiconductor layer with a catalytic element for promoting crystallization;
   heating the amorphous semiconductor layer provided with the catalytic element to obtain a crystalline semiconductor layer;
   forming a gate insulating film on the crystalline semiconductor layer;
   forming a first conductive film on the gate insulating film and a second conductive film on the first conductive film;
   etching the first conductive film and the second conductive film to form a first gate electrode, a second gate electrode, and a third gate electrode;
   doping the semiconductor layer with an n-type impurity element while using the first gate electrode, the second gate electrode, and the third gate electrode as masks;
   etching the first gate electrode, the second gate electrode, and the third gate electrode to form a fourth gate electrode of an n-channel TFT in a driver circuit, a fifth gate electrode, and a sixth gate electrode;
   doping the semiconductor layer with an n-type impurity element while using the fourth gate electrode, the fifth gate electrode, and the sixth gate electrode as masks;
   etching the fifth gate electrode and the sixth gate electrode to form a seventh gate electrode and an eighth gate electrode of a pixel TFT, respectively, while covering with a resist mask the n-channel TFT that is formed in the driving circuit;
   etching the seventh gate electrode to form a ninth gate electrode of a p-channel TFT in the driver circuit;
   removing the gate insulating film while using the fourth gate electrode, the ninth gate electrode, and the eighth gate electrode as masks; and
   doping the semiconductor layer in the p-channel TFT with a p-type impurity element while covering the n-channel TFT and the pixel TFT with a resist mask and using the ninth gate electrode as a mask.

25. A method according to claim 24, wherein each of the fourth gate electrode, the eighth gate electrode, and the ninth gate electrode comprises the first conductive film and the second conductive film, and the first conductive film is wider than the second conductive film.

26. A method of manufacturing an electrical device, comprising steps of:
   forming an amorphous semiconductor layer on an insulating surface;
   providing the amorphous semiconductor layer with a catalytic element for promoting crystallization;
   heating the amorphous semiconductor layer provided with the catalytic element to and then irradiating the semiconductor layer with a laser to obtain a crystalline semiconductor layer;
   forming a gate insulating film on the crystalline semiconductor layer;
   forming a first conductive film on the gate insulating film and a second conductive film on the first conductive film;
   etching the first conductive film and the second conductive film to form a first gate electrode, a second gate electrode, and a third gate electrode;

doping the semiconductor layer with an n-type impurity element while using the first gate electrode, the second gate electrode, and the third gate electrode as masks;

etching the first gate electrode, the second gate electrode, and the third gate electrode to form a fourth gate electrode of an n-channel TFT in a driver circuit, a fifth gate electrode, and a sixth gate electrode;

doping the semiconductor layer with an n-type impurity element while using the fourth gate electrode, the fifth gate electrode, and the sixth gate electrode as masks;

etching the fifth gate electrode and the sixth gate electrode to form a seventh gate electrode and an eighth gate electrode of pixel TFT, respectively, while covering with a resist mask the n-channel TFT that is formed in the driving circuit;

etching the seventh gate electrode to form a ninth gate electrode of a p-channel TFT in the driver circuit;

removing the gate insulating film while using the fourth gate electrode, the ninth gate electrode, and the eighth gate electrode as masks; and doping the semiconductor layer in the p-channel TFT with a p-type impurity element while covering the n-channel TFT and the pixel TFT with a resist mask and using the ninth gate electrode as a mask.

27. A method according to claim 26, wherein each of the fourth gate electrode, the eighth gate electrode, and the ninth gate electrode comprises the first conductive film and the second conductive film, and the first conductive film is wider than the second conductive film.

28. A method according to claim 26, wherein the laser is selected from the group consisting of a pulse oscillation type KrF excimer laser, XeCl excimer laser, YAG laser, and $YVO_4$ laser.

* * * * *